(12) United States Patent
Park

(10) Patent No.: US 10,448,508 B2
(45) Date of Patent: Oct. 15, 2019

(54) PRINTED CIRCUIT BOARD AND SEMICONDUCTOR PACKAGE INCLUDING THE SAME

(71) Applicant: Samsung Electronics Co., Ltd., Suwon-si, Gyeonggi-do (KR)

(72) Inventor: Soo-jae Park, Gyeonggi-do (KR)

(73) Assignee: SAMSUNG ELECTRONICS CO., LTD. (KR)

(*) Notice: Subject to any disclaimer, the term of this patent is extended or adjusted under 35 U.S.C. 154(b) by 113 days.

(21) Appl. No.: 15/465,574

(22) Filed: Mar. 21, 2017

(65) Prior Publication Data

US 2017/0280560 A1 Sep. 28, 2017

(30) Foreign Application Priority Data

Mar. 22, 2016 (KR) .................. 10-2016-0033997

(51) Int. Cl.
*H05K 1/00* (2006.01)
*H05K 1/11* (2006.01)
*H01L 23/48* (2006.01)

(52) U.S. Cl.
CPC .............. *H05K 1/113* (2013.01); *H01L 23/48* (2013.01); *H01L 2224/16225* (2013.01); *H01L 2924/15311* (2013.01); *H01L 2924/181* (2013.01); *H05K 2201/094* (2013.01); *H05K 2201/098* (2013.01); *H05K 2201/099* (2013.01); *H05K 2201/09745* (2013.01); *H05K 2201/09845* (2013.01);
(Continued)

(58) Field of Classification Search
CPC .......... H05K 2201/09845; H05K 2201/09854; H05K 2201/09863; H05K 3/4061; H05K 3/4069; H05K 3/4602; H05K 2201/0305; H05K 2201/09572; H05K 2203/045; H05K 2203/0455; H05K 2201/09718; H05K 3/4046; H05K 2201/037; H05K 1/113; H05K 2201/094; H05K 2201/09745; H05K 2201/098; H05K 2201/099; H05K 2201/10378; H05K 2201/10674; H01L 23/48; H01L 2224/16225; H01L 2924/15311; H01L 2924/181
See application file for complete search history.

(56) References Cited

U.S. PATENT DOCUMENTS 6,002,172 A 12/1999 Desai et al.
6,306,750 B1 10/2001 Huang et al.
(Continued)

FOREIGN PATENT DOCUMENTS

JP 2004172416 A 6/2004
KR 100287393 B1 4/2001
(Continued)

*Primary Examiner* — Pete T Lee
(74) *Attorney, Agent, or Firm* — Renaissance IP Law Group LLP

(57) ABSTRACT

A printed circuit board (PCB) having a reliable electrical connection with connection terminals and a semiconductor package including the PCB, the printed circuit board including: a substrate base; a plurality of pads disposed on upper and lower surfaces of the substrate base; and a solder resist layer configured to cover at least a portion of the upper and lower surfaces of the substrate base, wherein at least some of the plurality of pads are groove pads comprising at least one annular groove in a side opposite to the substrate base.

13 Claims, 29 Drawing Sheets

(52) U.S. Cl.
CPC .............. *H05K 2201/10378* (2013.01); *H05K 2201/10674* (2013.01)

(56) References Cited

U.S. PATENT DOCUMENTS

| | | | |
|---|---|---|---|
| 6,387,734 B1 * | 5/2002 | Inaba | .................. H01L 23/3114 |
| | | | 257/701 |
| 7,180,181 B2 | 2/2007 | Liu et al. | |
| 8,211,793 B2 | 7/2012 | Lee et al. | |
| 8,350,385 B2 | 1/2013 | Hochstenbach | |
| 8,368,227 B2 * | 2/2013 | Cheng | ............... H01L 21/76898 |
| | | | 257/667 |
| 9,681,534 B2 * | 6/2017 | Otsubo | .................. H05K 1/113 |
| 2005/0017346 A1 * | 1/2005 | Yamagata | ......... H01L 23/49816 |
| | | | 257/701 |
| 2007/0170556 A1 | 7/2007 | Chung et al. | |
| 2008/0042290 A1 | 2/2008 | Lee et al. | |
| 2009/0257209 A1 | 10/2009 | Han et al. | |

FOREIGN PATENT DOCUMENTS

| | | |
|---|---|---|
| KR | 100699892 B1 | 3/2007 |
| KR | 100782485 B1 | 12/2007 |
| KR | 20090108954 A | 10/2009 |
| KR | 101009187 B1 | 1/2011 |
| KR | 101120285 B1 | 3/2012 |
| KR | 101351188 B1 | 1/2014 |
| KR | 20140003152 A | 1/2014 |
| KR | 20140081433 A | 7/2014 |

* cited by examiner

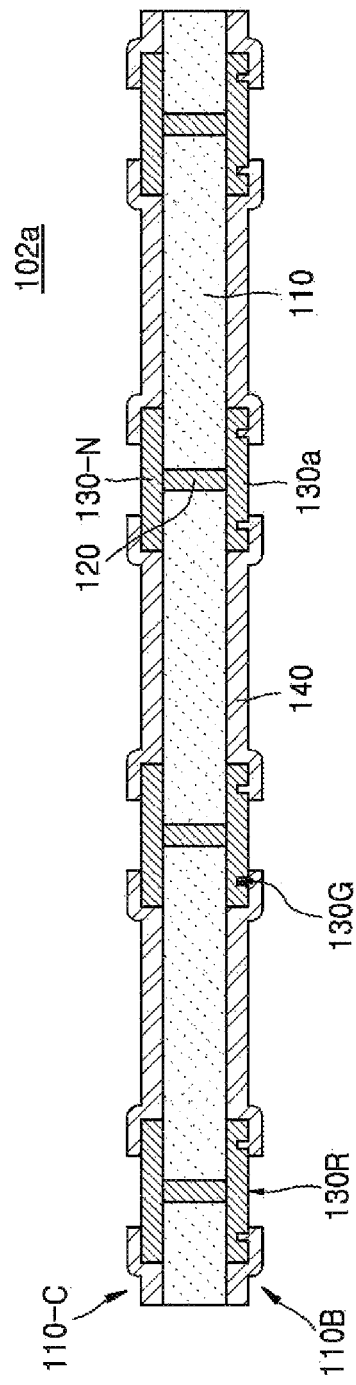
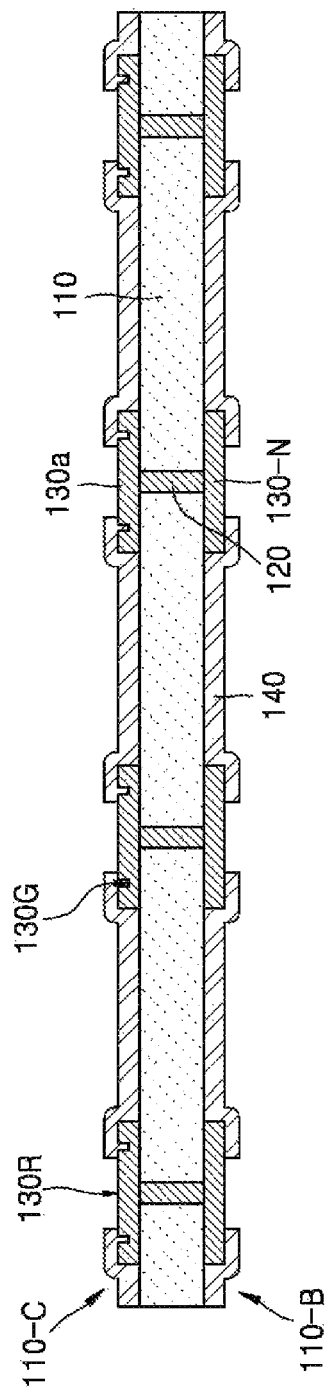

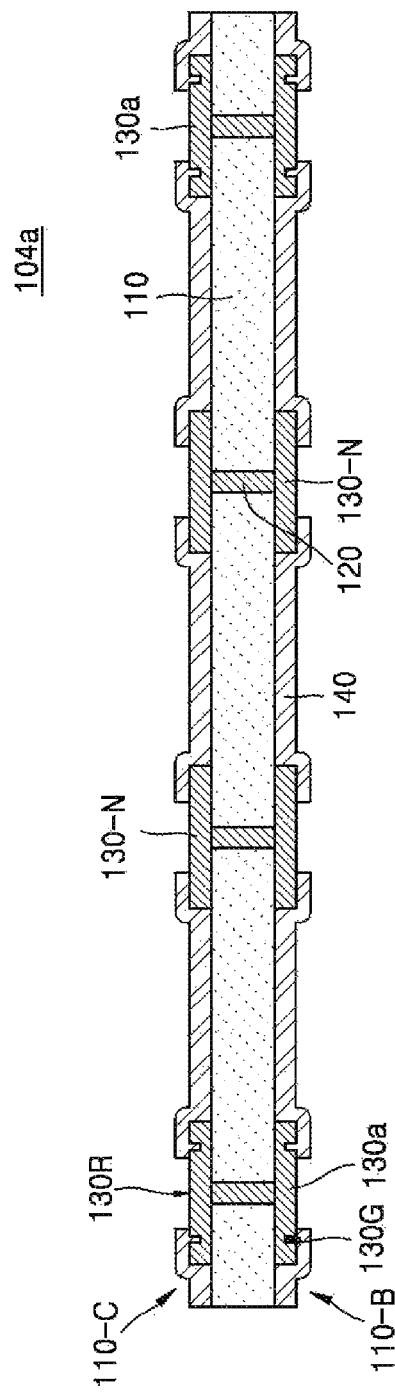
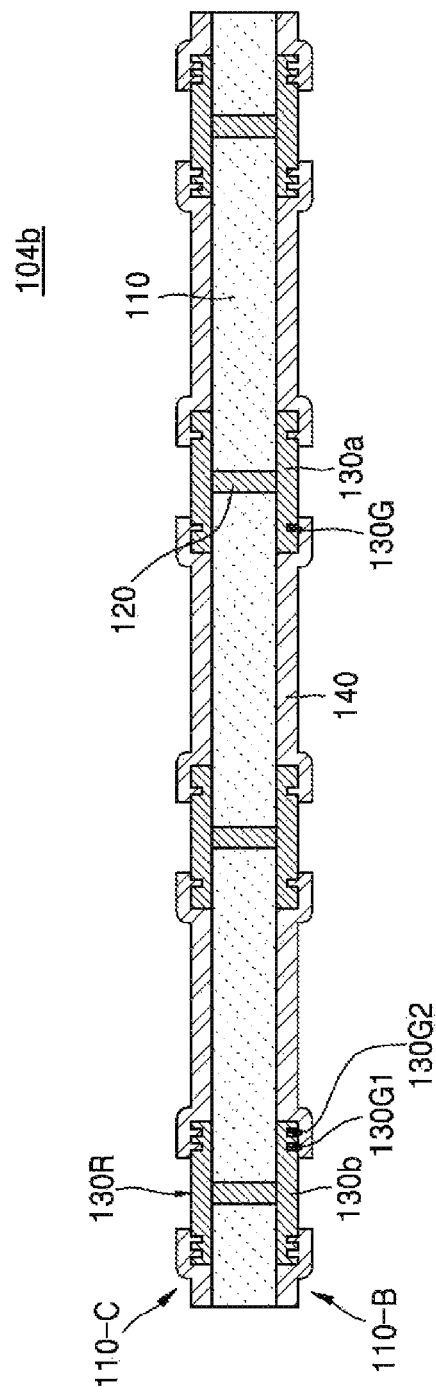

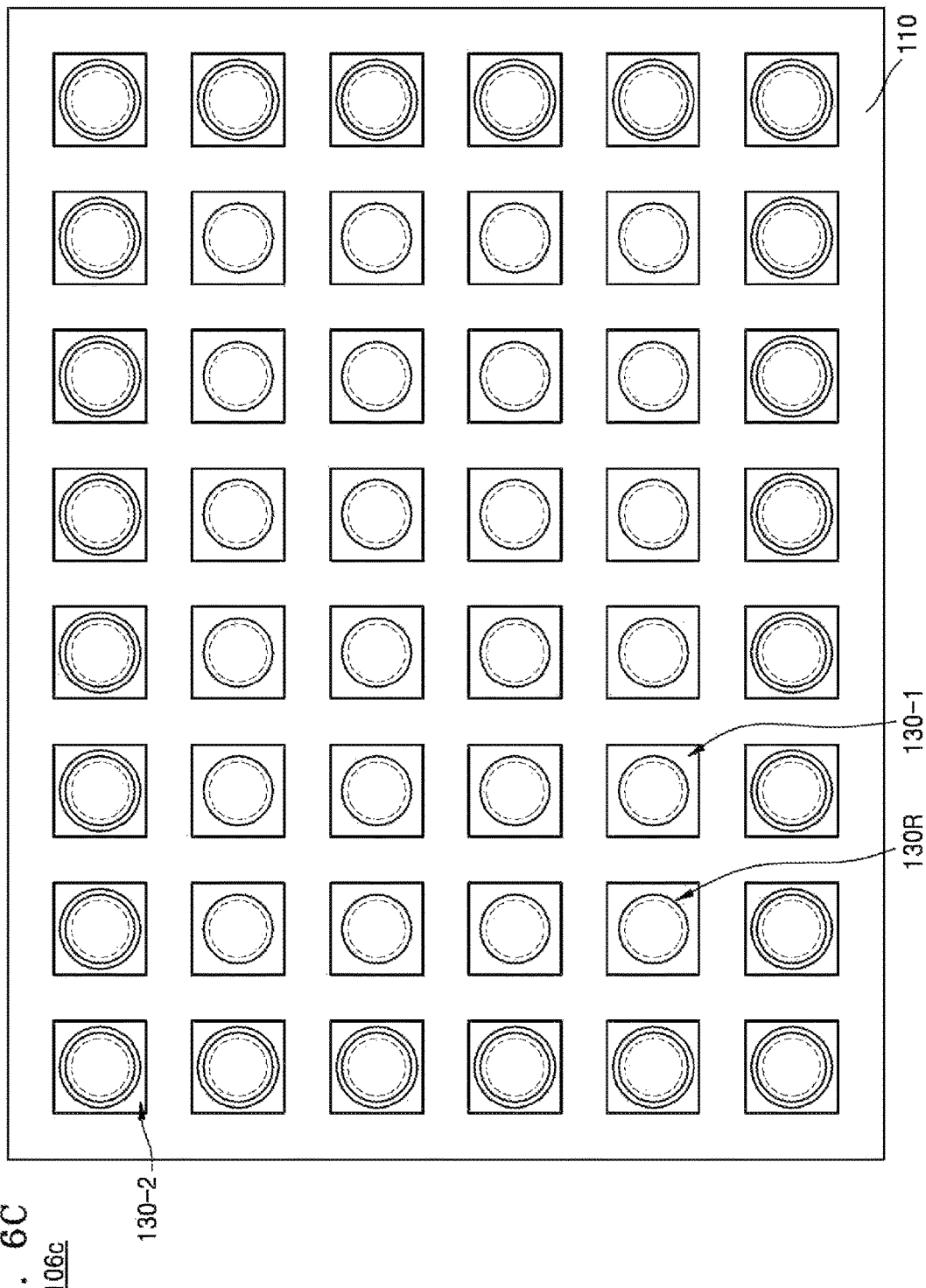

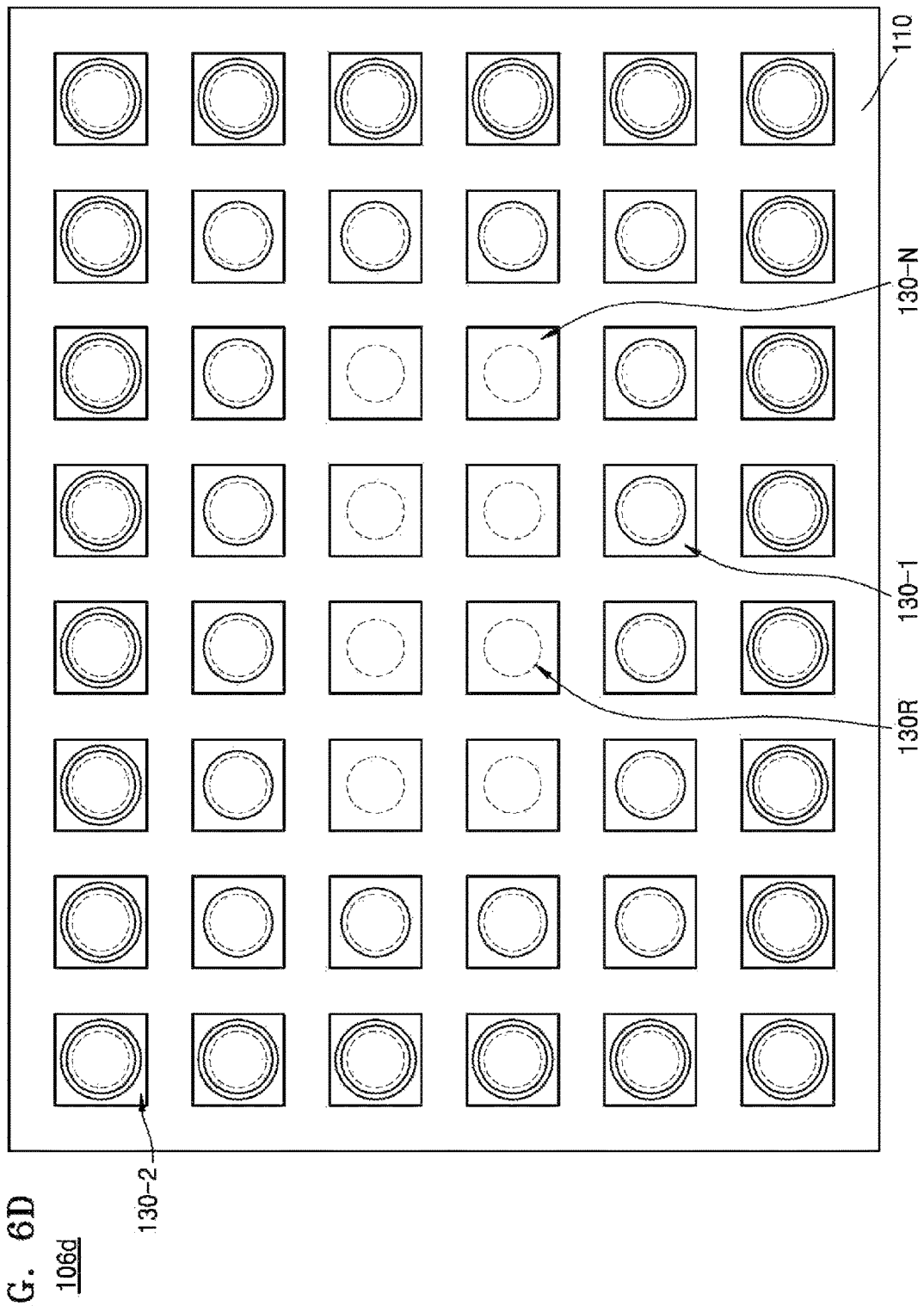

106e

106f

… (1) …

PRINTED CIRCUIT BOARD AND SEMICONDUCTOR PACKAGE INCLUDING THE SAME

CROSS-REFERENCE TO RELATED APPLICATION

This application claims the benefit of Korean Patent Application No. 10-2016-0033997, filed on Mar. 22, 2016, in the Korean Intellectual Property Office, the disclosure of which is incorporated herein in its entirety by reference.

BACKGROUND

The inventive concept relates to a printed circuit board (PCB) and a semiconductor package including the PCB, and more particularly, to a PCB having pads connected to connection terminals and a semiconductor package including the PCB.

As the electronics industry has rapidly developed and a user demand for various electronic devices has increased, electronic systems are required to have high-performance functions and smaller sizes. Accordingly, an increase in the number of connection terminals connected to a PCB included in an electronic system and a reduction in intervals and sizes of the connection terminals are also required.

SUMMARY

The inventive concept provides a printed circuit board (PCB) having a reliable electrical connection with connection terminals in spite of a reduction in intervals and sizes of the connection terminals and a semiconductor package including the PCB.

According to an aspect of the inventive concept, there is provided a printed circuit board (PCB) includes: a substrate base; a plurality of pads disposed on upper and lower surfaces of the substrate base; and a solder resist layer covering at least a portion of the upper and lower surfaces of the substrate base. At least some of the plurality of pads may be groove pads comprising at least one annular groove in a side opposite to the substrate base.

According to another aspect of the inventive concept, there is provided a semiconductor package includes: a printed circuit board comprising a substrate base, a plurality of pads disposed on upper and lower surfaces of the substrate base, and a solder resist layer covering a portion of the lower surface of the substrate base; a semiconductor chip electrically connected to the plurality of pads disposed on the upper surface of the substrate base; and a plurality of connection terminals attached to corresponding ones of the plurality of pads disposed on the lower surface of the substrate base. At least some of the plurality of pads may be groove pads comprising at least one annular groove in a side opposite to the substrate base.

BRIEF DESCRIPTION OF THE DRAWINGS

Embodiments of the inventive concept will be more clearly understood from the following detailed description taken in conjunction with the accompanying drawings in which:

FIGS. 4A and 4B are cross-sectional views of PCBs according to some other embodiments;

FIGS. 5A and 5B are cross-sectional views of PCBs according to some other embodiments;

FIGS. 6A through 6F are plan views of PCBs according to some embodiments;

DETAILED DESCRIPTION OF THE EMBODIMENTS

The inventive concept will now be described more fully with reference to the accompanying drawings, in which embodiments of the inventive concept are shown.

Figure 1:
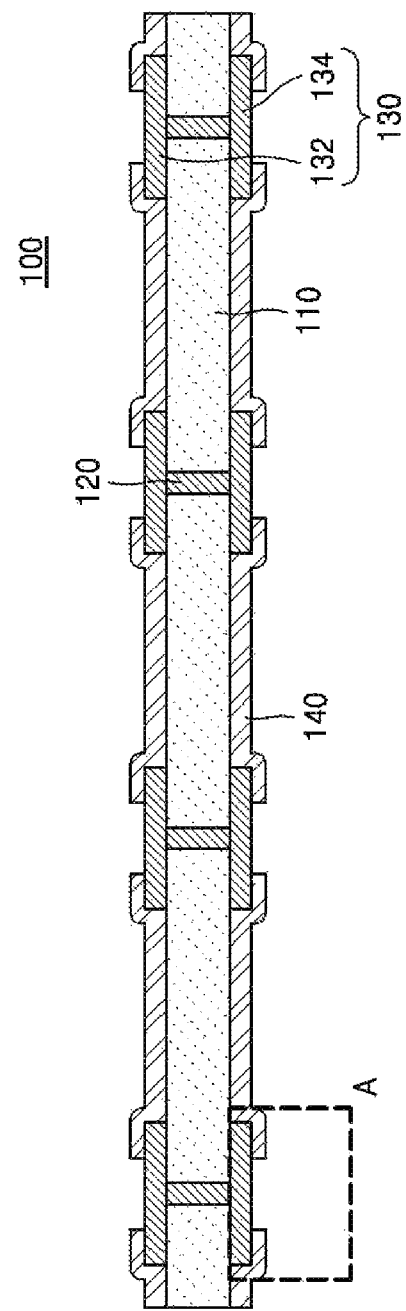
FIG. 1 is a cross-sectional view of a printed circuit board (PCB) according to an embodiment.

FIG. 1 is a cross-sectional view of a printed circuit board (PCB) 100 according to an embodiment.

Referring to FIG. 1, the PCB 100 may include a substrate base 110, a plurality of pads 130 disposed on upper and lower surfaces of the substrate base 110, and a solder resist layer 140 covering at least a portion of the upper and lower surfaces of the substrate base 110. The plurality of pads 130 may include an upper pad 132 disposed on the upper surface of the substrate base 110 and a lower pad 134 disposed on the lower surface of the substrate base 110.

The PCB 100 may be a flexible PCB (FPCB), a rigid PCB (RPCB), or a combination of the FPCB and the RPCB.

The substrate base 110 may include at least one material selected from phenolic resin, epoxy resin, and polyimide. For example, the substrate base 110 may include at least one material selected from frame retardant 4 (FR4), tetrafunctional epoxy, polyphenylene ether, epoxy/polyphenylene oxide, bismaleimide triazine (BT), thermount, cyanate ester, polyimide, and liquid crystal polymer. In some embodiments, the substrate base 110 may include, for example, polyester (PET), polyester telephthalate, fluorinated ethylene propylene (FEP), resin-coated paper, liquid polyimide resin, a polyethylene naphthalate (PEN) film and so on. The substrate base 110 may have a single layer structure or a multi-layer structure including multiple base layers.

Connection wirings 120 may be formed through the substrate base 110 between a pair of the plurality of pads 130 disposed opposite to each other with the substrate base 110 therebetween. For example, the connection wiring 120 may pass through the substrate base 110 and connect the upper pad 132 to the lower pad 134. In some embodiments, the connection wiring 120 may extend through and/or along a portion of the upper or lower surface of the substrate base 110.

In FIG. 1, the connection wiring 120 has a shape of a through electrode, but the shape of the connection wiring 120 is not limited thereto. In some embodiments, when the substrate base 110 has multiple base layers, the connection wiring 120 may penetrate through all of the base layers or may extend through only one or more but fewer than all of the plurality of base layers.

The connection wiring 120 may include, for example, electrolytically deposited (ED) copper, a rolled-annealed (RA) copper foil, a stainless steel foil, an aluminum foil, ultra-thin copper foils, sputtered copper, copper alloys, nickel, stainless steel, or beryllium copper and so on.

The plurality of pads 130 may include the same material as the connection wiring 120 and/or plated copper. In some embodiments, the plurality of pads 130 may include Ni/Au, etc., on a side of the pads 130 opposite to the substrate base 110.

The solder resist layer 140 may include a polyimide film, a polyester film, a flexible solder mask, photoimageable coverlay (PIC), a photoimageable solder resist, etc. The solder resist layer 140 may be formed by, for example, directly coating the substrate base 110 with thermosetting ink by using silk screen printing or inkjet printing and thermally hardening the coated thermosetting ink. The solder resist layer 140 may be formed by, for example, entirely coating the substrate base 110 with a photoimageable solder resist by using screen printing or spray coating, removing an unnecessary portion by using exposure and development, and thermally hardening the coated photoimageable solder resist.

The solder resist layer 140 may cover a portion of each of the plurality of pads 130. At least some of the plurality of pads 130 may be groove pads each having at least one annular groove in a side opposite to the substrate base 110. The groove pads will be described in detail with reference to FIGS. 2A through 2D.

FIGS. 2A through 2D are enlarged cross-sectional views of groove pads 130a, 130b, 130c, and 130d of a PCB according to some embodiments. More specifically, FIGS. 2A through 2D are enlarged cross-sectional views of examples of pads 130 at a portion A of FIG. 1. That is, one or more of the plurality of pads 130 are groove pads 130a, 130b, 130c, or 130d. Locations of such groove pads 130a, 130b, 130c, and 130d are not limited to the portion A of FIG. 1 and groove pads 130a, 130b, 130c, 130d, or the like may be used for some or all of the plurality of pads 130, i.e., the upper pad 132 and/or the lower pad 134. Furthermore, the type of groove pad used for the pads 130 may be the same or different across the substrate base 110.

Figure 2A:
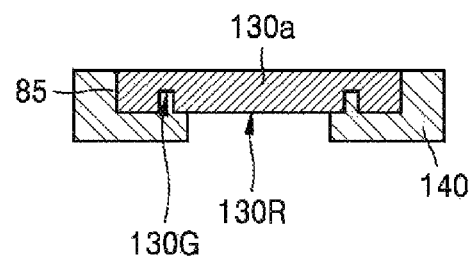
FIGS. 2A through 2D are enlarged cross-sectional views of groove pads of a PCB according to some embodiments.

Referring to FIG. 2A, the groove pad 130a may include a groove such as an annular groove 130G in a side opposite to the substrate base 110 as illustrated in, for example, FIG. 1. The annular groove 130G may be spaced apart from a side surface 85 of the groove pad 130a. For example, the annular groove 130G may have a substantially uniform width and thus substantially uniform separation from the side surface 85 of the groove pad 130a. Inner and outer edges of the annular groove 130G may have a substantially circular shape in plan view. That is, a shape of the annular groove 130G in plan view may have a substantially ring shape.

The solder resist layer 140 may partially cover the groove pad 130a and define a connection terminal contact region 130R of the groove pad 130a. A connection terminal may be attached to the connection terminal contact region 130R. The annular groove 130G may substantially surround the connection terminal contact region 130R. The annular groove 130G may surround wholly or partially the connection terminal contact region 130R (see FIGS. 6A through 6F).

If the annular groove 130G is not formed, the stress may be concentrated in an edge region of a contact surface (or an interface region) between the groove pad 130a and the connection terminal. Such stress concentration may damage an intermetallic compound formed in the contact surface between the groove pad 130a and the connection terminal, which may degrade the reliability of an electrical connection between the connection terminal and the PCB.

However, when the connection terminal is attached to the groove pad 130a including the annular groove 130G, since the stress changes to be concentrated at a corner of a lower surface of the annular groove 130G, the intermetallic compound formed in the contact surface between the groove pad 130a and the connection terminal may not be damaged, and thus, the electrical connection between the connection terminal and the PCB may be more reliable. In particular, the groove pad 130a around the corner of the lower surface of the annular groove 130G is an integrally-formed metal material, and thus the groove pad 130a may not be damaged due to the stress concentration.

The solder resist layer 140 may fill at least a portion of the annular groove 130G. Thus, the annular groove 130G may be covered by the solder resist layer 140 and may not be exposed to the outside. The solder resist layer 140 may also cover a portion of the surface of the groove pad 130a inside of the annular groove 130G. Thus, the connection terminal contact region 130R may be spaced apart from the annular groove 130G.

Figure 2B:
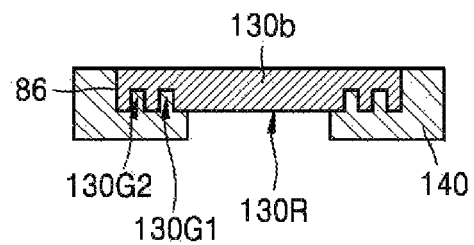

Referring to FIG. 2B, the groove pad 130b may include annular grooves 130G1 and 130G2 in the side opposite to the substrate base 110 of FIG. 1. The annular grooves 130G1 and 130G2 may include the first annular groove 130G1 and the second annular groove 130G2 that are spaced apart from each other. The first annular groove 130G1 and the second annular groove 130G2 may have substantially the same depth. Each of the first annular groove 130G1 and the second annular groove 130G2 may be spaced apart from the side surface 86 of the groove pad 130b similar to the annular groove 130G of FIG. 2A. However, the first annular groove 130G1 and the second annular groove 130G2 may be concentric and be separated from a side surface 86 of the groove pad 130b by different distances. Inner and outer edges of each of the first annular groove 130G1 and the second annular groove 130G2 may have a substantially circular shape in plan view. That is, the shape of each of the first annular groove 130G1 and the second annular groove 130G2 in plan view may have a substantially ring shape.

The solder resist layer 140 may partially cover the groove pad 130b and define the connection terminal contact region 130R of the groove pad 130b. A connection terminal may be attached to the connection terminal contact region 130R as shown in, for example, FIG. 7A. The first annular groove 130G1 may surround the connection terminal contact region 130R. The second annular groove 130G2 may also surround the first annular groove 130G1, thereby forming concentric ring-shaped grooves in plan view. The first annular groove 130G1 and the second annular groove 130G2 may surround wholly or partially the connection terminal contact region 130R (see FIGS. 6A through 6F).

When the connection terminal is attached to the groove pad 130b including the first annular groove 130G1 and the second annular groove 130G2, because the stress changes to be concentrated at a corner of a lower surface of each of the first annular groove 130G1 and the second annular groove 130G2, an intermetallic compound formed in a contact surface (or an interface region) between the groove pad 130b and the connection terminal may not be damaged, and thus an electrical connection between the connection terminal and the PCB may be more reliable. In particular, the groove pad 130b around the corner of the lower surface of each of the first annular groove 130G1 and the second annular groove 130G2 includes an integrally formed metal material, and thus the groove pad 130b may not be damaged due to the stress concentration.

The solder resist layer 140 may fill the first annular groove 130G1 and the second annular groove 130G2. Thus, the first annular groove 130G1 and the second annular groove 130G2 may be covered by the solder resist layer 140 and may not be exposed to the outside. The solder resist layer 140 may cover a portion of the surface of the groove pad 130b within the first annular groove 130G1. Thus, the connection terminal contact region 130R may be spaced apart from the first annular groove 130G1 and the second annular groove 130G2.

The annular grooves 130G1 and 130G2 include the two first annular groove 130G1 and the second annular groove 130G2 in FIG. 2B, but the inventive concept is not limited thereto. The annular grooves 130G1 and 130G2 may include three or more annular grooves spaced apart from each other. The three or more annular grooves may have substantially the same depth. In some other embodiments, these multiple grooves may have the different depths from each other.

Figure 2C:
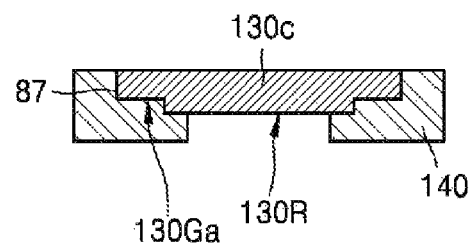

Referring to FIG. 2C, the groove pad 130c may include an annular groove 130Ga in the side opposite to the substrate base 110 of FIG. 1. The annular groove 130Ga may extend inwardly from a side surface 87 of the groove pad 130c. An inner edge of the annular groove 130Ga may have a substantially circular shape in plan view and an outer edge thereof may have the same shape as that of a perimeter of the groove pad 130c, for example, a rectangular shape in plan view.

The solder resist layer 140 may partially cover the groove pad 130c and define the connection terminal contact region 130R of the groove pad 130c. A connection terminal may be attached to the connection terminal contact region 130R. The annular groove 130G may surround the connection terminal contact region 130R. The annular groove 130G may surround wholly or partially the connection terminal contact region 130R (see FIGS. 6A through 6F).

When the connection terminal is attached to the groove pad 130c including the annular groove 130Ga, the since stress changes to be concentrated at a corner of a lower surface of the annular groove 130Ga, an intermetallic compound formed in a contact surface of the groove pad 130c and the connection terminal is not damaged, and thus the electrical connection between the connection terminal and the PCB may be more reliable. In particular, the groove pad 130c around the corner of the lower surface of the annular groove 130Ga includes an integrally formed metal material, and thus the groove pad 130c may not be damaged due to the stress concentration.

The solder resist layer 140 may fill the annular groove 130Ga. Thus, the annular groove 130Ga may be covered by the solder resist layer 140 and may not be exposed to the outside. The solder resist layer 140 may also cover a portion of the surface of the groove pad 130c within the annular groove 130Ga. Thus, the connection terminal contact region 130R may be spaced apart from the annular groove 130Ga.

Figure 2D:
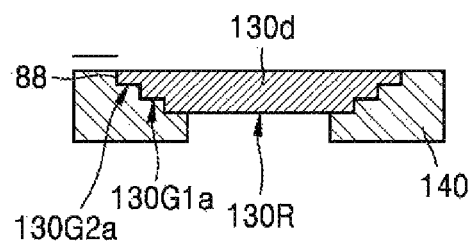

Referring to FIG. 2D, the groove pad 130d may include annular grooves 130G1a and 130G2a in the side opposite to the substrate base 110 of FIG. 1. The annular grooves 130G1a and 130G2a may include the first annular groove 130G1a and the second annular groove 130G2a that are connected to each other. The first annular groove 130G1a and the second annular groove 130G2a may have different depths. A depth of the second annular groove 130G2a may be greater than a depth of the first annular groove 130G1a. The second annular groove 130G2a may extend inwardly from a side surface 88 of the groove pad 130d. An inner edge of the second annular groove 130G2a may have a circular shape in plan view and an outer edge thereof may have the same shape as that of a perimeter of the groove pad 130d, for example, a rectangular shape in plan view. Inner and outer edges of each of the first annular groove 130G1a may have a substantially circular shape in plan view. That is, the shape of the first annular groove 130G1a in plan view may have a substantially ring shape. In addition, the inner edge of the second annular groove 130G2a may be coincident with the outer edge of the first annular groove 130G1a.

The solder resist layer 140 may partially cover the groove pad 130d and define the connection terminal contact region 130R of the groove pad 130d that is not covered by the solder resist layer 140. A connection terminal may be attached to the connection terminal contact region 130R. The first annular groove 130G1a may surround the connection terminal contact region 130R. The second annular groove 130G2a may surround the first annular groove 130G1a. The first annular groove 130G1a and the second annular groove 130G2a may surround wholly or partially the connection terminal contact region 130R (see FIGS. 6A through 6F).

When the connection terminal is attached to the groove pad 130d including the first annular groove 130G1a and the second annular groove 130G2a, since the stress changes to be concentrated at a corner of a lower surface of each of the first annular groove 130G1a and the second annular groove 130G2a, an intermetallic compound formed in a contact surface of the groove pad 130d and the connection terminal is not damaged, and thus an electrical connection between the connection terminal and the PCB may become more reliable. In particular, the groove pad 130d around the corner of the lower surface of each of the first annular groove 130G1a and the second annular groove 130G2a is an integrally formed metal material, and thus the groove pad 130d may not be damaged due to the stress concentration.

The solder resist layer 140 may fill the first annular groove 130G1a and the second annular groove 130G2a. Thus, the first annular groove 130G1a and the second annular groove 130G2a may be covered by the solder resist layer 140 and may not be exposed to the outside. The solder resist layer 140 may also cover the inside of the groove pad 130d from the first annular groove 130G1a. Thus, the connection terminal contact region 130R may be spaced apart from the first annular groove 130G1a and the second annular groove 130G2a.

The annular grooves 130G1a and 130G2a include the two first annular groove 130G1a and the second annular groove 130G2a in FIG. 2D, but the inventive concept is not limited thereto. The annular grooves 130G1*a* and 130G2*a* may include three or more annular grooves connected to each other and having different depths.

Although the annular groove described herein have been described in some embodiments as being uniformly spaced from a side surface of the groove pad, in other embodiments, the groove pad may have different shapes such that the groove or grooves may be separated from the side surface of the groove pad by a varying distance around the groove pad.

FIGS. 3A through 3D are respectively cross-sectional views of the PCBs 100*a*, 100*b*, 100*c*, and 100*d* according to some embodiments. FIGS. 3A through 3D illustrate an example in which all the pads 130 of FIG. 1 are groove pads. More specifically, FIGS. 3A through 3D illustrate examples in which the groove pads 130*a*, 130*b*, 130*c*, and 130*d* of FIGS. 2A through 2D are used for all of the pads 130 of FIG. 1. Redundant descriptions with respect to FIGS. 3A through 3D and FIGS. 1 through 2D are omitted.

Figure 3A:
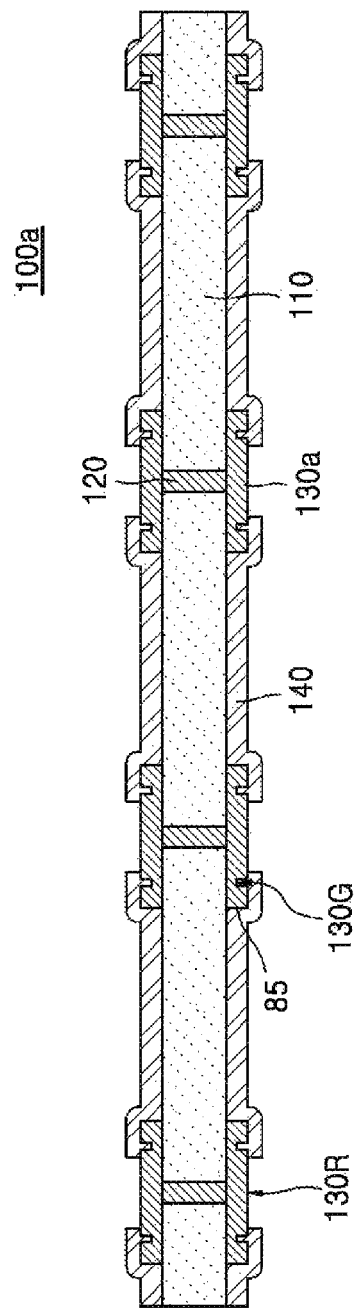
FIGS. 3A through 3D are cross-sectional views of PCBs according to some embodiments.

Referring to FIG. 3A, the PCB 100*a* may include the substrate base 110, the plurality of groove pads 130*a* disposed on upper and lower surfaces of the substrate base 110, and the solder resist layer 140 covering at least a portion of the upper and lower surfaces of the substrate base 110. The plurality of groove pads 130*a* may be disposed on the upper and lower surfaces of the substrate base 110.

The plurality of groove pads 130*a* may include the annular groove 130G in a side opposite to the substrate base 110. The annular groove 130G may be spaced apart from the side surface 85 of the groove pad 130*a*. For example, the annular groove 130G may have a substantially uniform width and thus substantially uniform separation from the side surface 85 of the groove pad 130*a*. Inner and outer edges of the annular groove 130G may have a circular shape in plan view. That is, the shape of the annular groove 130G in plan view may have a substantially ring shape.

The solder resist layer 140 may partially cover the groove pad 130*a* and define the connection terminal contact region 130R of the groove pad 130*a* that is not covered by the solder resist layer 140. A connection terminal (not illustrated) may be attached to the connection terminal contact region 130R. The annular groove 130G may substantially surround the connection terminal contact region 130R.

The solder resist layer 140 may fill the annular groove 130G. Thus, the annular groove 130G may be covered by the solder resist layer 140 and may not be exposed to the outside. The solder resist layer 140 may also cover the inside of the groove pad 130*a* from the annular groove 130G. Thus, the connection terminal contact region 130R may be spaced apart from the annular groove 130G.

Figure 3B:
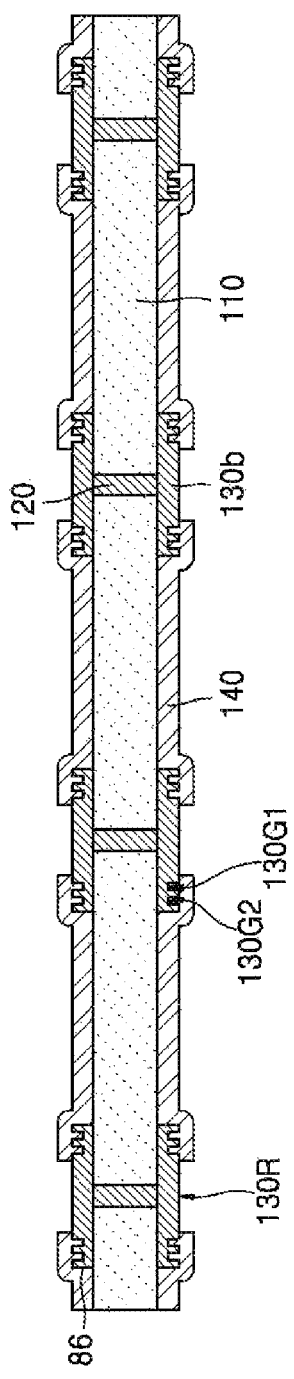

Referring to FIG. 3B, the PCB 100*b* may include the substrate base 110, the plurality of groove pads 130*b* disposed on upper and lower surfaces of the substrate base 110, and the solder resist layer 140 covering at least a portion of the upper and lower surfaces of the substrate base 110. The plurality of groove pads 130*b* may be disposed on the upper and lower surfaces of the substrate base 110.

The plurality of groove pads 130*b* may include the annular grooves 130G1 and 130G2 in a side opposite to the substrate base 110. The annular grooves 130G1 and 130G2 may include the first annular groove 130G1 and the second annular groove 130G2 that are spaced apart from each other. The first annular groove 130G1 and the second annular groove 130G2 may have substantially the same depth. The first annular groove 130G1 and the second annular groove 130G2 may be spaced apart from the side surface 86 of the groove pad 130*b*.

For example, the annular grooves 130G1 and 130G2 may have a substantially uniform width and thus substantially uniform separation from the side surface 86 of the groove pad 130*b*.

Inner and outer edges of each of the first annular groove 130G1 and the second annular groove 130G2 may have a substantially circular shape in plan view. That is, the shape of each of the first annular groove 130G1 and the second annular groove 130G2 in plan view may have a substantially ring shape.

The solder resist layer 140 may partially cover the groove pad 130*b* and define the connection terminal contact region 130R of the groove pad 130*b* that is not covered by the solder resist layer 140. A connection terminal may be attached to the connection terminal contact region 130R. The first annular groove 130G1 may surround the connection terminal contact region 130R. The second annular groove 130G2 may surround the first annular groove 130G1.

The solder resist layer 140 may fill the first annular groove 130G1 and the second annular groove 130G2. Thus, the first annular groove 130G1 and the second annular groove 130G2 may be covered by the solder resist layer 140 and may not be exposed to the outside. The solder resist layer 140 may also cover the inside of the groove pad 130*b* from the first annular groove 130G1. Thus, the connection terminal contact region 130R may be spaced apart from the first annular groove 130G1 and the second annular groove 130G2.

Figure 3C:
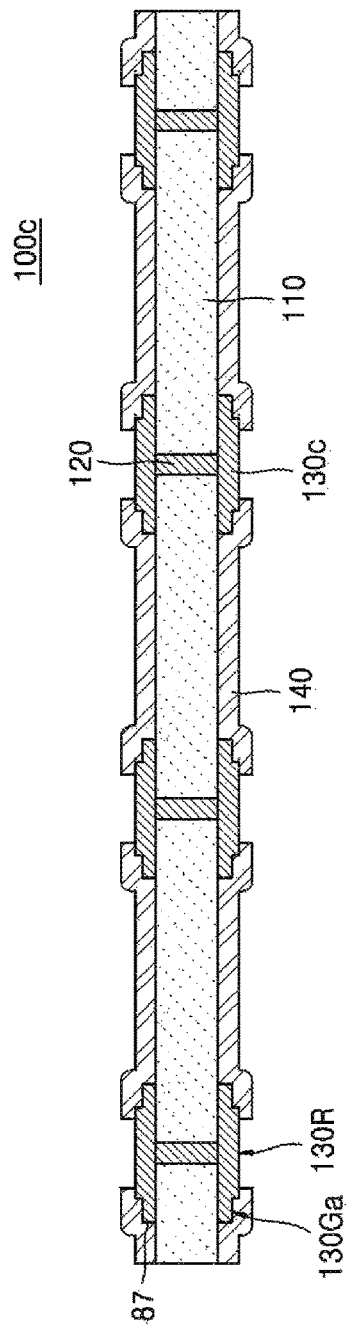

Referring to FIG. 3C, the PCB 100*c* may include the substrate base 110, the plurality of groove pads 130*c* disposed on upper and lower surfaces of the substrate base 110, and the solder resist layer 140 covering at least a portion of the upper and lower surfaces of the substrate base 110. The plurality of groove pads 130*c* may be disposed on the upper and lower surfaces of the substrate base 110.

The groove pad 130*c* may include the annular groove 130Ga in a side opposite to the substrate base 110. The annular groove 130Ga may extend inwardly from the side surface 87 of the groove pad 130*c*. An inner edge of the annular groove 130Ga may have a circular shape in plan view and an outer edge thereof may have the same shape as that of a perimeter of the groove pad 130*c*, for example, a rectangular shape in plan view.

The solder resist layer 140 may partially cover the groove pad 130*c* and define the connection terminal contact region 130R of the groove pad 130*c* that is not covered by the solder resist layer 140. A connection terminal may be attached to the connection terminal contact region 130R. The annular groove 130Ga may substantially surround the connection terminal contact region 130R.

The solder resist layer 140 may fill the annular groove 130Ga. Thus, the annular groove 130Ga may be covered by the solder resist layer 140 and may not be exposed to the outside. The solder resist layer 140 may also cover the inside of the groove pad 130*c* from the annular groove 130Ga. Thus, the connection terminal contact region 130R may be spaced apart from the annular groove 130Ga.

Figure 3D:
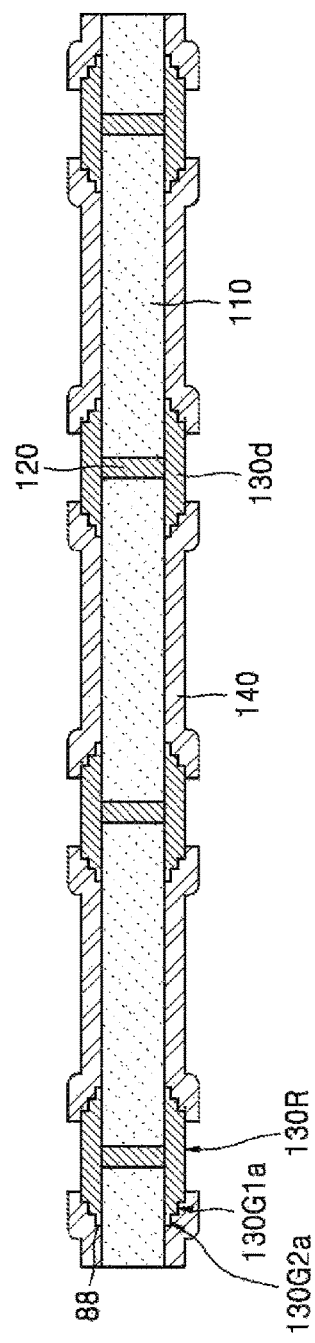

Referring to FIG. 3D, the PCB 100*d* may include the substrate base 110, the plurality of groove pads 130*d* disposed on upper and lower surfaces of the substrate base 110, and the solder resist layer 140 covering at least a portion of the upper and lower surfaces of the substrate base 110. The plurality of groove pads 130*d* may be disposed on the upper and lower surfaces of the substrate base 110.

The groove pad 130*d* may include annular grooves 130G1*a* and 130G2*a* in a side opposite to the substrate base 110. The annular grooves 130G1*a* and 130G2*a* may include the first annular groove 130G1a and the second annular groove 130G2a that are connect to each other. The first annular groove 130G1a and the second annular groove 130G2a may have different depths. A value of a depth of the second annular groove 130G2a may be greater than that of the first annular groove 130G1a. The second annular groove 130G2a may extend inwardly from the side surface 88 of the groove pad 130d. An inner edge of the second annular groove 130G2a may have a circular shape in plan view and an outer edge thereof may have the same shape as that of a perimeter of the groove pad 130d, for example, a rectangular shape in plan view. Inner and outer edges of each of the first annular groove 130G1a may have a substantially circular shape in plan view. That is, the shape of the first annular groove 130G1a in plan view may have a substantially ring shape.

The solder resist layer 140 may partially cover the groove pad 130d and define the connection terminal contact region 130R of the groove pad 130d that is not covered by the solder resist layer 140. A connection terminal may be attached to the connection terminal contact region 130R. The first annular groove 130G1a may surround the connection terminal contact region 130R. The second annular groove 130G2a may surround the first annular groove 130G1a.

The solder resist layer 140 may fill the first annular groove 130G1a and the second annular groove 130G2a. Thus, the first annular groove 130G1a and the second annular groove 130G2a may be covered by the solder resist layer 140 and may not be exposed to the outside. The solder resist layer 140 may also cover the inside of the groove pad 130d from the first annular groove 130G1a. Thus, the connection terminal contact region 130R may be spaced apart from the first annular groove 130G1a and the second annular groove 130G2a.

FIGS. 4A and 4B are cross-sectional views of PCBs 102a and 102b according to some other embodiments.

Referring to FIG. 4A, the PCB 102a may include the substrate base 110, a plurality of planar pads 130-N disposed on an upper surface 110-C of the substrate base 110, the plurality of groove pads 130a disposed on a lower surface 110-B of the substrate base 110, and the solder resist layer 140 covering at least a portion of upper and lower surfaces of the substrate base 110.

No annular groove may be formed in the plurality of planar pads 130-N disposed on the upper surface 110-C of the substrate base 110, whereas the annular groove 130G may be formed in the groove pad 130a disposed on the lower surface 110-B.

As used herein, a planar pad may be a pad that has a relatively planar surface and to which a connection terminal is attached since an annular groove is not formed therein. This does not mean that a planar pad as used herein is a pad that has a completely planar surface and to which the connection terminal is attached. In some embodiments, a conductive layer such as Ni/Au may be further formed in the connection terminal contact region 130R of the planar pad 130-N so that the planar pad 130-N to which the connection terminal is attached has a stepped surface.

Figure 17A:
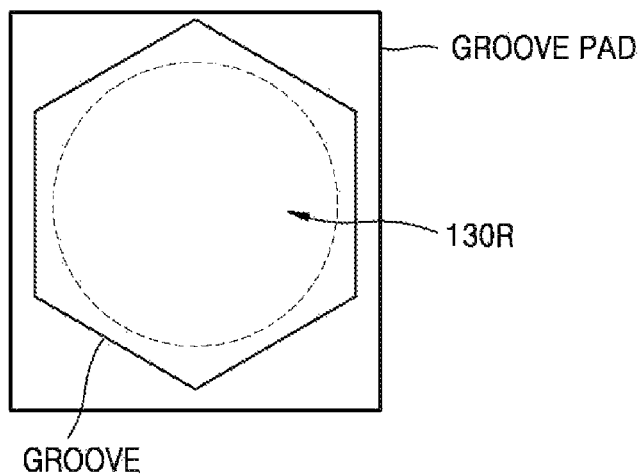
FIGS. 17A and 17B are plan views of grooves formed in groove pads according to some embodiments.
Figure 17B:
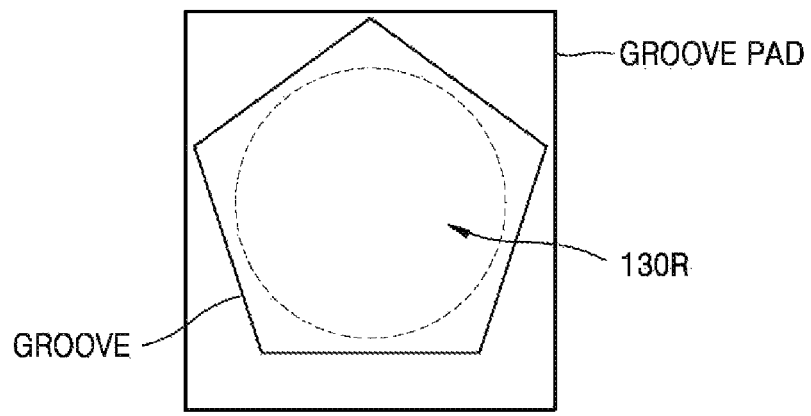

In contrast with a planar pad, a grove pad discussed above may be a pad having a groove formed therein. The groove may be an annual groove as discussed above or the groove may have other shapes such as a hexagon shape as shown in FIG. 17A or a pentagon shape as shown in FIG. 17B or any other suitable shape including an octagon or square shape within the spirit and scope of the claimed invention.

In some embodiments, a semiconductor chip (not illustrated) may be attached to the upper surface 110-C of the substrate base 110, and an external device (not illustrated) may be connected to the lower surface 110-B of the substrate base 110. In some embodiments, a PCB (a main board) of the external device may be attached to the lower surface 110-B of the substrate base 110. For example, when the stress occurring between a chip connection terminal to be connected to the semiconductor chip and the planar pad 130-N is smaller than the stress occurring between a main connection terminal to be connected to the main board and the groove pad 130a, no annular groove may be formed in the planar pad 130-N, whereas the annular groove 130G may be formed in the groove pad 130a.

Referring to FIG. 4B, the PCB 102b may include the substrate base 110, the plurality of groove pads 130a disposed on the upper surface 110-C of the substrate base 110, the plurality of planar pads 130-N disposed on the lower surface 110-B of the substrate base 110, and the solder resist layer 140 covering at least a portion of upper and lower surfaces of the substrate base 110.

No annular groove may be formed in the plurality of planar pads 130-N disposed on the lower surface 110-B of the substrate base 110, whereas the annular groove 130G may be formed in the groove pad 130a disposed on the upper surface 110-C.

In some embodiments, the PCB 102b may be a main board in which a semiconductor package is attached to the upper surface 110-C thereof and an external connection terminal to be connected to the outside is attached to the lower surface 110-B thereof. For example, when the stress occurring between a chip connection terminal, which connects the semiconductor chip with the substrate base 110, and the groove pad 130a is greater than the stress occurring between an external connection terminal and the planar pad 130-N, no annular groove may be formed in the planar pad 130-N, whereas the annular groove 130G may be formed in the groove pad 130a.

FIGS. 5A and 5B are cross-sectional views of PCBs 104a and 104b according to some other embodiments.

Referring to FIG. 5A, the PCB 104a may include the substrate base 110, the plurality of planar pads 130-N and the plurality of groove pads 130a disposed on the upper surface 110-C and the lower surface 110-B of the substrate base 110, and the solder resist layer 140 covering at least a portion of upper and lower surfaces of the substrate base 110.

No annular groove may be formed in the planar pads 130-N disposed in an inner region (a central region) of the substrate base 110, whereas the annular groove 130G may be formed in the groove pads 130a disposed on an edge region of the substrate base 110.

In some embodiments, when the stress occurring in an edge region of the PCB 104a is greater than the stress occurring in an inner region (or central region) the PCB 104a, the annular groove 130G may be formed in the groove pad 130a disposed along the edge region (or perimeter) of the substrate base 110, whereas no annular groove may be formed in the planar pad 130-N disposed in inner regions of the surfaces of the substrate base 110.

Referring to FIG. 5B, the PCB 104b may include the substrate base 110, the plurality of first groove pads 130a and the plurality of second groove pads 130b disposed on the upper surface 110-C and the lower surface 110-B of the substrate base 110, and the solder resist layer 140 covering at least a portion of upper and lower surfaces of the substrate base 110.

The number of the annular grooves 130G included in the first groove pad 130a disposed on the substrate base 110 may be smaller than the number of the annular grooves 130G1 and 130G2 included in the second groove pad 130b disposed along the edge region of the substrate base 110.

In some embodiments, when the stress occurring in the edge region (or near a perimeter) of the PCB 104b is greater than the stress occurring inside the PCB 104b, a relatively greater number of annular grooves 130G1 and 130G2 may be formed in the second groove pad 130b disposed along the perimeter of the substrate base 110, and a relatively smaller number of annular grooves 130G may be formed in the first groove pad 130a disposed inside the substrate base 110.

FIGS. 6A through 6F are plan views of PCBs 106a through 106f according to some embodiments. More specifically, FIGS. 6A through 6F illustrate layouts of pads of one surface of a PCB, where a solder resist layer is not illustrated for clarity.

Figure 6A:
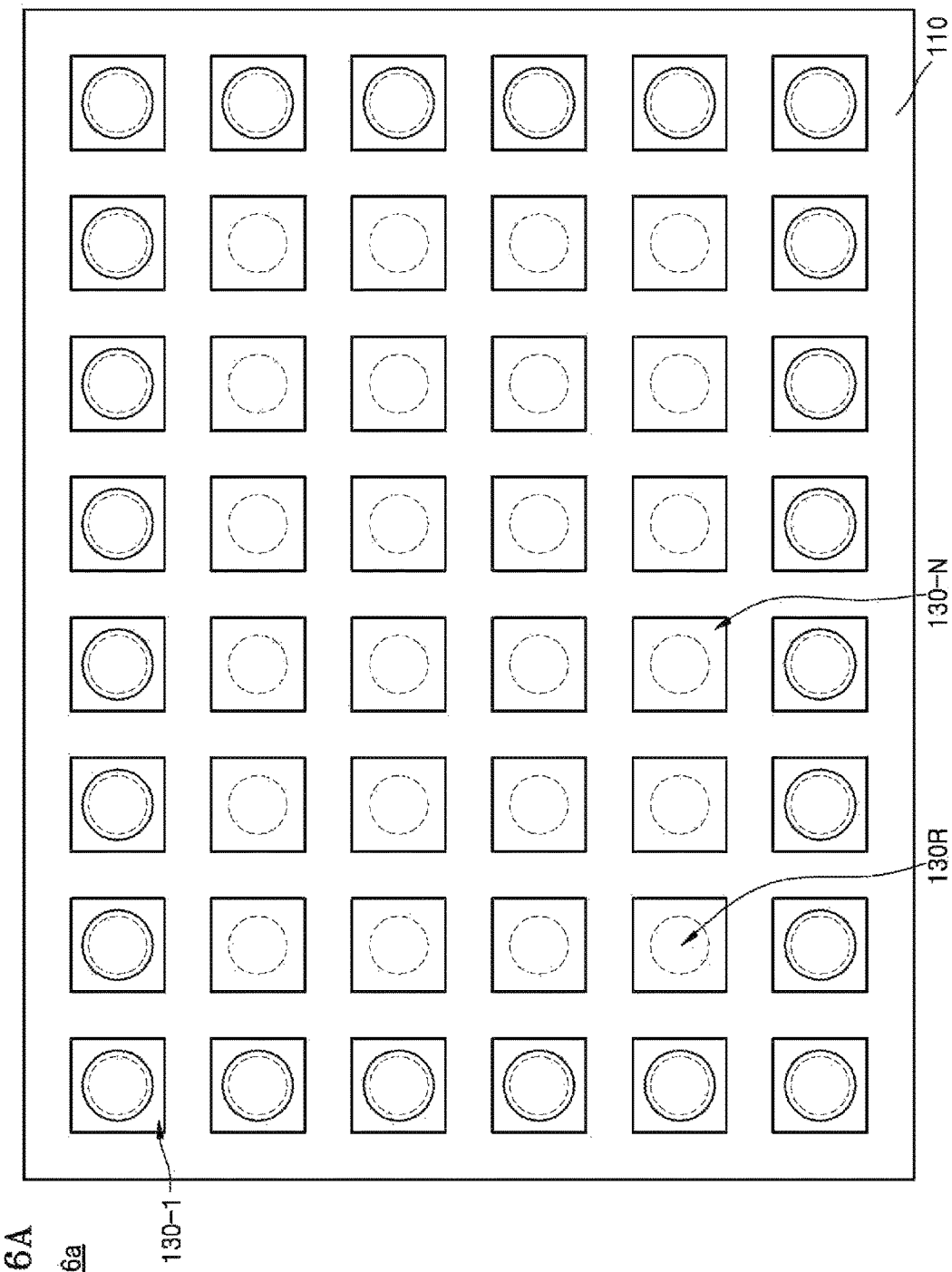

Referring to FIG. 6A, the PCB 106a may include the substrate base 110 and a plurality of pads 130-N and 130-1 disposed on one surface of the substrate base 110. The plurality of pads 130-N and 130-1 may include the planar pads 130-N and the groove pad 130-1. The groove pad 130-1 may be the groove pad 130a of FIG. 2A or the groove pad 130c of FIG. 2C. The groove pad 130-1 may include the annular groove 130G of FIG. 2A or 130Ga of FIG. 2C. No annular groove may be formed in the planar pad 130-N.

Each of the plurality of pads 130-N and 130-1 may include the connection terminal contact region 130R in a central portion. A connection terminal may be attached to the connection terminal contact region 130R. A solder resist layer may be formed on one surface of the PCB 106a to expose the connection terminal contact region 130R and cover the remaining portion of the PCB 106a.

The groove pad 130-1 may be disposed in an edge region (or along a perimeter) of the substrate base 110. The planar pad 130-N may be disposed on the substrate base 110 in an inner region (or a central region) of the substrate base 110. That is, unlike an arrangement of the groove pad 130-1, the planar pad 130-N may be disposed in the substrate base 110 offset from the perimeter of the substrate base 110.

The groove pads 130-1 are disposed in a single line extending along the perimeter of the substrate base 110 in FIG. 6A, but the inventive concept is not limited thereto. In some embodiments, the two or more groups (or rows) of groove pads 130-1 may be disposed along the perimeter of the substrate base 110. For example, two or more rows of the groove pads 130-1 may be disposed between a given planar pad 130-N and the perimeter of the substrate base 110.

When the stress occurring in an edge region of the PCB 106a is greater than the stress occurring in an inner region, i.e., a central region, of the PCB 106a, the groove pad 130-1 including the annular groove 130G of FIG. 2A or 130Ga of FIG. 2C may be disposed in the edge region of the substrate base 110, thereby preventing an intermetallic compound formed in a contact surface (or an interface region) between the groove pad 130-1 and the connection terminal (not illustrated in FIG. 6A for the sake of simplicity) from being damaged when the connection terminal is attached to the groove pad 130-2.

Figure 6B:
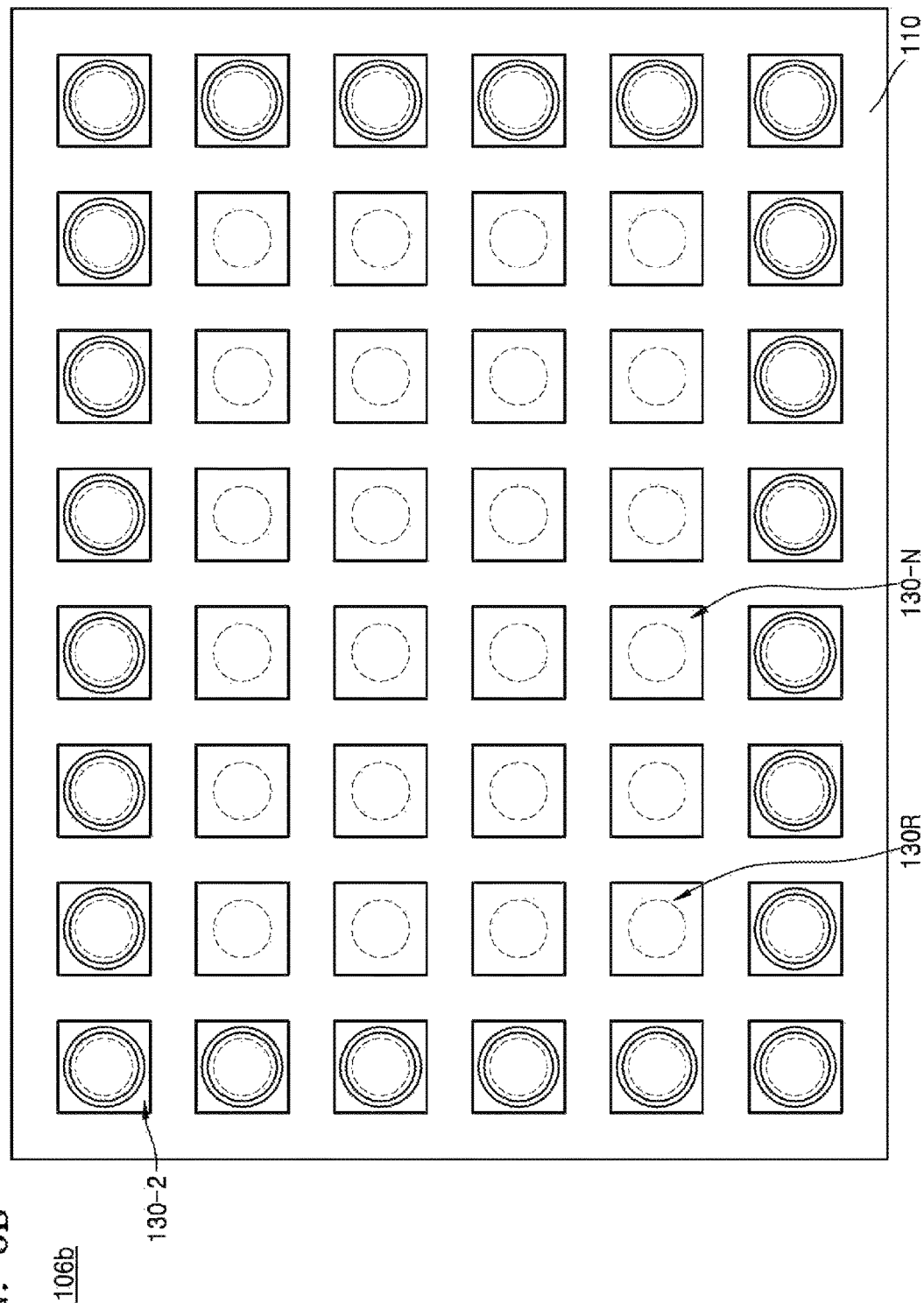

Referring to FIG. 6B, the PCB 106b may include the substrate base 110 and a plurality of pads 130-N and 130-2 disposed on one surface of the substrate base 110. The plurality of pads 130-N and 130-2 may include the planar pads 130-N and the groove pad 130-2. The groove pad 130-2 may be the groove pad 130b of FIG. 2B or the groove pad 130d of FIG. 2D. The groove pad 130-2 may include the two or more concentric annular grooves 130G1 and 130G2 of FIG. 2A or 130Ga1 and 130Ga2 of FIG. 2C. No annular groove may be formed in the planar pad 130-N.

Each of the plurality of pads 130-N and 130-2 may include the connection terminal contact region 130R in a central portion thereof. A connection terminal may be attached to the connection terminal contact region 130R. A solder resist layer may be formed on one surface of the PCB 106b to expose the connection terminal contact region 130R and cover a remaining portion of the PCB 106b.

The groove pad 130-2 may be disposed along an edge region of the substrate base 110. The planar pad 130-N may be disposed in an inner region of the substrate base 110. That is, unlike an arrangement of the groove pad 130-2, the planar pad 130-N may be disposed in the substrate base 110 offset from the perimeter of the substrate base 110.

The groove pads 130-2 are disposed in a single line along the perimeter of the substrate base 110 in FIG. 6B but the inventive concept is not limited thereto. In some embodiments, the two or more groups of groove pads 130-2 may be disposed along the perimeter of the substrate base 110.

When the stress occurring in an edge region of the PCB 106b is greater than the stress occurring inside the PCB 106b, the groove pad 130-2 including the annular grooves 130G1 and 130G2 of FIG. 2A or 130Ga1 and 130Ga2 of FIG. 2C may be disposed in the edge region of the substrate base 110, thereby preventing an intermetallic compound formed in a contact surface (or an interface region) between the groove pad 130-2 and the connection terminal (not illustrated in FIG. 6B for the sake of simplicity) from being damaged when the connection terminal is attached to the groove pad 130-2.

Referring to FIG. 6C, the PCB 106c may include the substrate base 110 and the plurality of pads 130-1 and 130-2 disposed on one surface of the substrate base 110. The plurality of pads 130-1 and 130-2 may include the first groove pads 130-1 and the second groove pads 130-2. The first groove pad 130-1 may be the groove pad 130a of FIG. 2A or the groove pad 130c of FIG. 2C. The second groove pad 130-2 may be the groove pad 130b of FIG. 2B or the groove pad 130d of FIG. 2D. The first groove pad 130-1 may include a relatively smaller number of annular grooves than that of the second groove pad 130-2. In some embodiments, the first groove pad 130-1 may include the one annular groove 130G of FIG. 2A or 130Ga of FIG. 2C, and the second groove pad 130-2 may include the two or more concentric annular grooves 130G1 and 130G2 of FIG. 2A or 130Ga1 and 130Ga2 of FIG. 2C.

Each of the plurality of pads 130-1 and 130-2 may include the connection terminal contact region 130R in a central portion thereof. A connection terminal may be attached to the connection terminal contact region 130R. A solder resist layer may be formed on one surface of the PCB 106c to expose the connection terminal contact region 130R and cover the remaining portion of the PCB 106c.

The second groove pad 130-2 may be disposed in an edge region (or along a perimeter) of the substrate base 110. The first groove pad 130-1 may be disposed on inner regions of the surfaces of the substrate base 110. That is, unlike an arrangement of the groove pad 130-2, the first groove pad 130-1 may be disposed on the substrate base 110 offset from the perimeter of the substrate base 110.

The second groove pads 130-2 are disposed in a single line extending along the perimeter of the substrate base 110 in FIG. 6C but is not limited thereto. In some embodiments, the two or more groups of second groove pads 130-2 may be disposed along the perimeter of the substrate base 110.

When the stress occurring in an edge region of the PCB 106c is greater than the stress occurring in an inner region, i.e., a central region of the PCB 106c, the second groove pad 130-2 including the two or more annular grooves 130G1 and 130G2 of FIG. 2B or 130Ga1 and 130Ga2 of FIG. 2D may be disposed in the edge region of the substrate base 110, and the first groove pad 130-1 including a smaller number of the annular grooves 130G of FIG. 2A or 130Ga of FIG. 2C than that of the second groove pad 130-2 may be disposed in the inner region of the substrate base 110, thereby preventing an intermetallic compound formed in a contact surface (or an interface region) between the second groove pad 130-2 and the connection terminal (not illustrated in FIG. 6C for the sake of simplicity) from being damaged when the connection terminal is attached to the second groove pad 130-2.

Referring to FIG. 6D, the PCB 106d may include the substrate base 110 and the plurality of pads 130-N, 130-1, and 130-2 disposed on one surface of the substrate base 110. The plurality of pads 130-N, 130-1, and 130-2 may include the planar pads 130-N, the first groove pads 130-1, and the second groove pads 130-2. The first groove pad 130-1 may be the groove pad 130a of FIG. 2A or the groove pad 130c of FIG. 2C. The second groove pad 130-2 may be the groove pad 130b of FIG. 2B or the groove pad 130d of FIG. 2D. The first groove pad 130-1 may include a relatively smaller number of annular grooves than that of the second groove pad 130-2. In some embodiments, the first groove pad 130-1 may include the one annular groove 130G of FIG. 2A or 130Ga of FIG. 2C, and the second groove pad 130-2 may include the two or more concentric annular grooves 130G1 and 130G2 of FIG. 2A or 130Ga1 and 130Ga2 of FIG. 2C. No annular groove may be formed in the planar pad 130-N.

Each of the plurality of pads 130-N, 130-1, and 130-2 may include the connection terminal contact region 130R in a central portion thereof. A connection terminal may be attached to the connection terminal contact region 130R. A solder resist layer may be formed on one surface of the PCB 106d to expose the connection terminal contact region 130R and cover the remaining portion of the PCB 106d.

The second groove pad 130-2 may be disposed on an edge region of the substrate base 110. Unlike an arrangement of the groove pad 130-2, the first groove pad 130-1 may be disposed in the substrate base 110. The planar pad 130-N may be disposed in the substrate base 110. That is, unlike an arrangement of the groove pad 130-2, the first groove pad 130-1 may be disposed in the substrate base 110 offset from the perimeter of the substrate base 110. Also, compared to the first groove pad 130-1, the planar pad 130-N may be disposed closer to a center of the substrate base 110 from the perimeter of the substrate base 110.

The first groove pads 130-1 and the second groove pads 130-2 are one by one disposed along the edge of the substrate base 110 in FIG. 6D but are not limited thereto. In some embodiments, the two or more first groove pads 130-1 and the two or more second groove pads 130-2 may be inwardly disposed along the edge of the substrate base 110 from the edge of the substrate base 110.

When the stress occurring in the PCB 106d becomes greater from the edge region of the PCB 106d toward the inner region of the PCB 106d, the second groove pad 130-2 including the two or more annular grooves 130G1 and 130G2 of FIG. 2B or 130Ga1 and 130Ga2 of FIG. 2D may be disposed in the edge region of the substrate base 110, and the first groove pad 130-1 including a smaller number of the annular grooves 130G of FIG. 2A or 130Ga of FIG. 2C than that of the second groove pad 130-2 may be disposed inside the substrate base 110, and, the planar pad 130-N may be disposed in the substrate base 110 closer to the center of the substrate base 110 than the first grove pad 130-1, thereby preventing an intermetallic compound formed in a contact surface between each of the first groove pad 130-1 and the second groove pad 130-2 and the connection terminal (not illustrated in FIG. 6D for the sake of simplicity) from being damaged due to the stress when the connection terminal is attached to the first groove pad 130-1 or the second groove pad 130-2, for example.

Figure 6E:
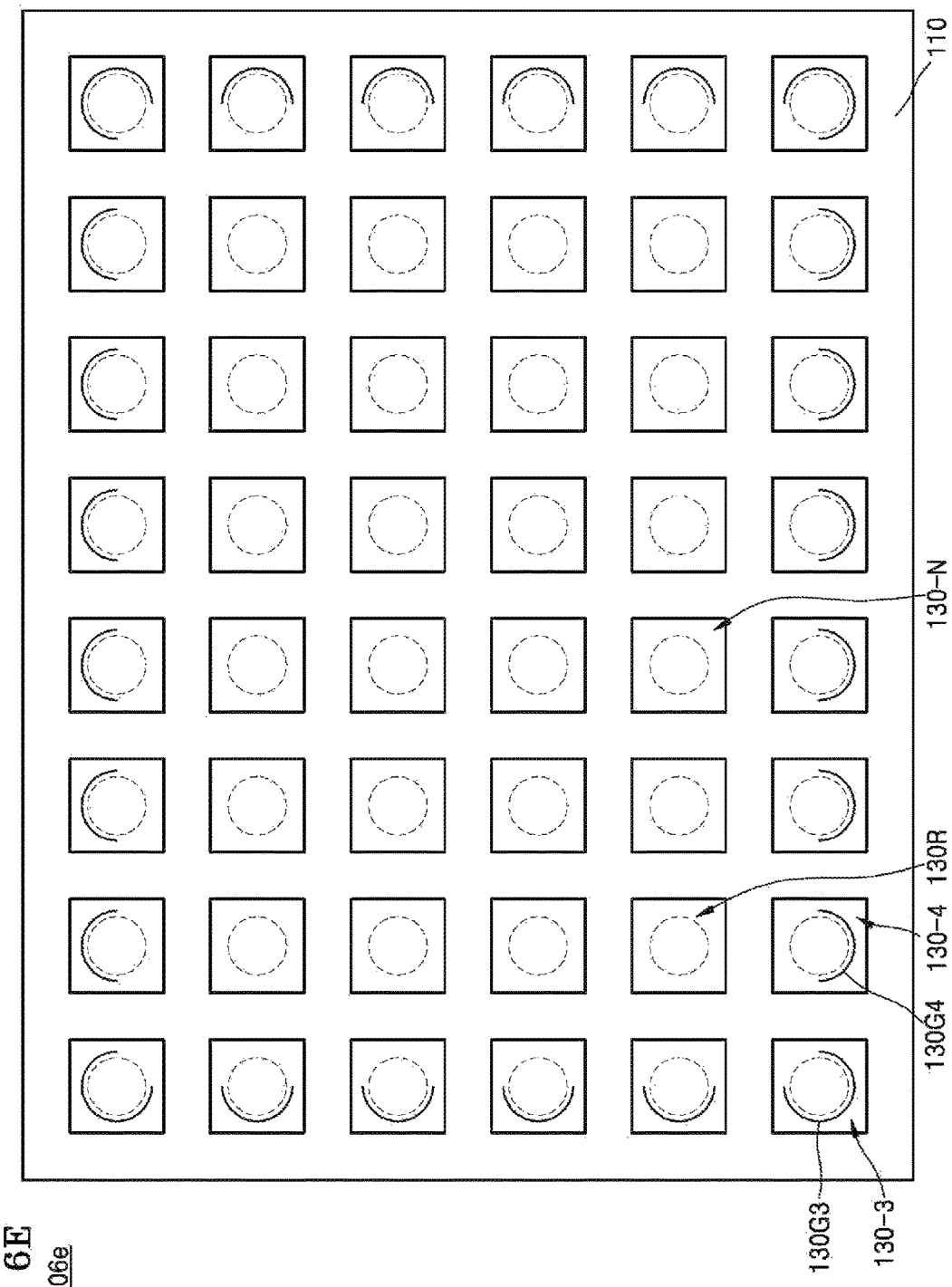

Referring to FIG. 6E, the PCB 106e may include the substrate base 110 and a plurality of pads 130-N, 130-3, and 130-4 disposed on one surface of the substrate base 110. The plurality of pads 130-N, 130-3, and 130-4 may include the planar pads 130-N and the groove pads 130-3 and 130-4. The groove pads 130-3 and 130-4 may be the groove pads 130a of FIG. 2A. The groove pads 130-3 and 130-4 may include annular grooves 130G3 and 130G4. No annular groove may be formed in the planar pad 130-N.

Each of the plurality of pads 130-N, 130-3, and 130-4 may include the connection terminal contact region 130R in a central portion thereof. A connection terminal may be attached to the connection terminal contact region 130R. A solder resist layer may be formed on one surface of the PCB 106e to expose the connection terminal contact region 130R and cover the remaining portion of the PCB 106e.

The groove pads 130-3 and 130-4 may be disposed on an edge region of the substrate base 110. The planar pad 130-N may be disposed inside the substrate base 110. That is, unlike an arrangement of the groove pads 130-3 and 130-4, the planar pad 130-N may be disposed in the substrate base 110 offset from the perimeter of the substrate base 110.

The annular grooves 130G3 and 130G4 of the groove pads 130-3 and 130-4 may surround only a portion of the connection terminal contact region 130R. The shape of each of the annular grooves 130G3 and 130G4 of the groove pads 130-3 and 130-4 in plan view may be a substantially circular shape. The annular grooves 130G3 and 130G4 of the groove pads 130-3 and 130-4 may be disposed to surround only a portion of the connection terminal contact region 130R in the edge region of the PCB 106e.

When the stress occurring in the edge region of the PCB 106e is greater than the stress occurring inside the PCB 106e, the groove pads 130-3 and 130-4 including the annular grooves 130G3 and 130G4 may be disposed in the edge region of the substrate base 110, thereby preventing an intermetallic compound formed in a contact surface between each of the groove pads 130-3 and 130-4 and the connection terminal from being damaged when the connection terminal is attached to the groove pads 130-3 or 130-4.

The groove pads 130-3 and 130-4 may include the third groove pad 130-3 and the fourth groove pad 130-4. The third groove pad 130-3 may be disposed adjacent to a corner of the substrate base 110. The fourth groove pad 130-4 may be disposed along the remaining portion of the edge region of the substrate base 110.

The annular groove 130G3 of the third groove pad 130-3 may surround a greater portion of the connection terminal contact region 130R than the annular groove 130G4 of the third groove pad 130-4. In some embodiments, the annular groove 130G3 of the third groove pad 130-3 may surround about 270° of the connection terminal contact region 130R, and the annular groove 130G4 of the third groove pad 130-4 may surround about 180° of the connection terminal contact region 130R but the inventive concept is not limited thereto. That is, the annular groove 130G3 of the third groove pad 130-3 and the annular groove 130G4 of the third groove pad 130-4 may be formed to surround different parts of the connection terminal contact region 130R in consideration of the stress occurring in the edge region of the PCB 106e.

Figure 6F:
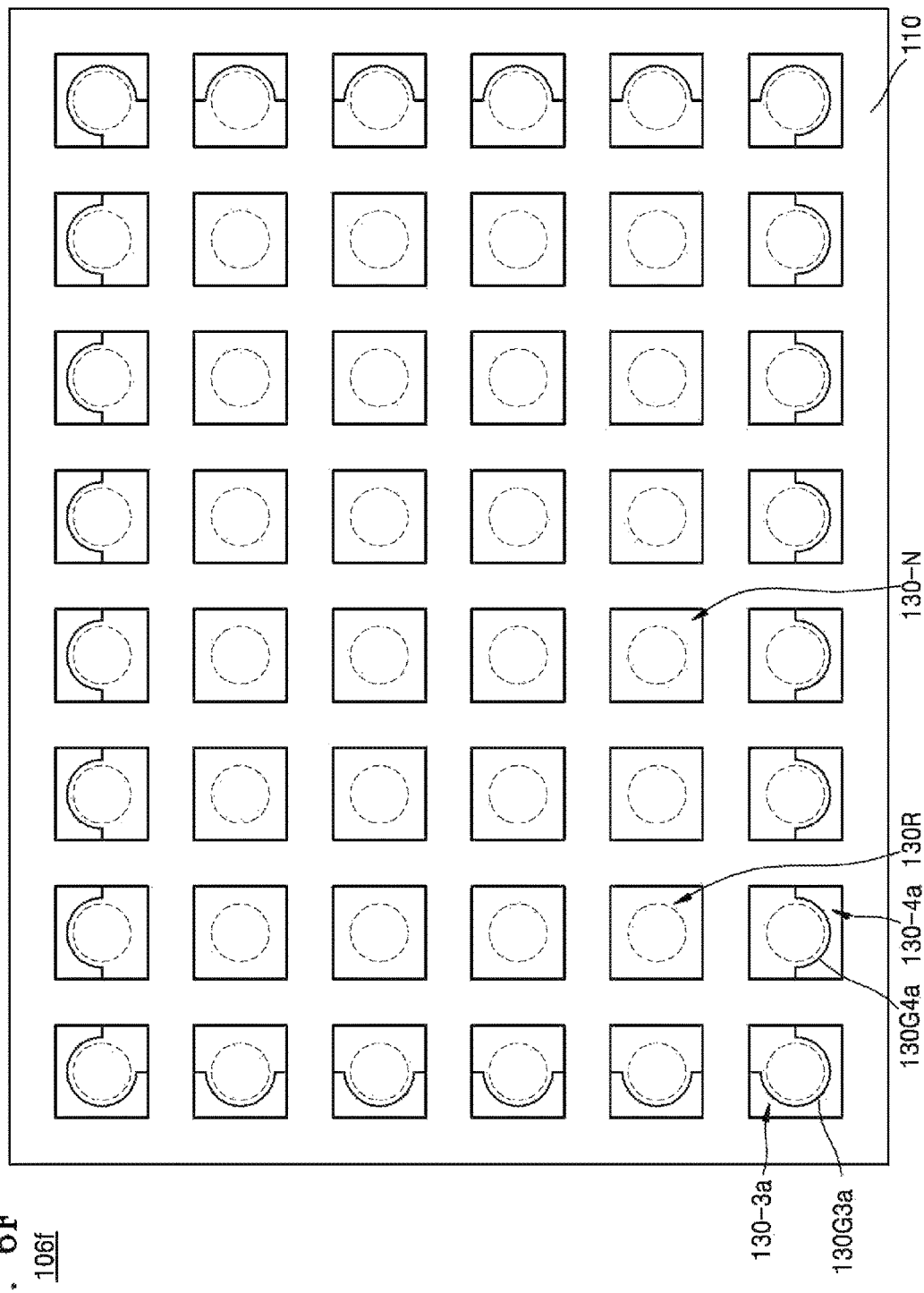

Referring to FIG. 6F, the PCB 106f may include the substrate base 110 and a plurality of pads 130-N, 130-3a, and 130-4a disposed on one surface of the substrate base 110. The plurality of pads 130-N, 130-3a, and 130-4a may include the planar pads 130-N and the groove pads 130-3a and 130-4a. The groove pads 130-3a and 130-4a may be the groove pads 130c of FIG. 2C. The groove pads 130-3a and 130-4a may include annular grooves 130G3a and 130G4a. No annular groove may be formed in the planar pad 130-N.

Each of the plurality of pads 130-N, 130-3a, and 130-4a may include the connection terminal contact region 130R in a central portion thereof. A connection terminal may be attached to the connection terminal contact region 130G. A solder resist layer may be formed on one surface of the PCB 106f to expose the connection terminal contact region 130R and cover the remaining portion of the PCB 106f.

The groove pads 130-3a and 130-4a may be disposed on an edge region of the substrate base 110. The planar pad 130-N may be disposed inside the substrate base 110. That is, unlike an arrangement of the groove pad 130-3a and 130-4a, the planar pad 130-N may be disposed inside the substrate base 110 offset from the perimeter of the substrate base 110.

The annular grooves 130G3a and 130G4a of the groove pads 130-3a and 130-4a may surround only a portion of the connection terminal contact region 130R. An inner edge of each of the annular grooves 130G3a and 130G4a of the groove pads 130-3a and 130-4a may have a substantially circular shape in plan view. The annular grooves 130G3a and 130G4a of the groove pads 130-3a and 130-4a may surround only a portion of the connection terminal contact region 130G in the edge region of the PCB 106f.

When the stress occurring in the edge region of the PCB 106f is greater than the stress occurring inside the PCB 106f, the groove pads 130-3a and 130-4a including the annular grooves 130G3a and 130G4a may be disposed in the edge region of the substrate base 110, thereby preventing an intermetallic compound formed in a contact surface between each of the groove pads 130-3a and 130-4a and the connection terminal from being damaged when the connection terminal is attached to the groove pads 130-3a or 130-4a.

The groove pads 130-3a and 130-4a may include the third groove pad 130-3a and the fourth groove pad 130-4a. The third groove pad 130-3a may be disposed adjacent to a corner of the substrate base 110. The fourth groove pad 130-4a may be disposed along the remaining portion of the edge region of the substrate base 110.

The annular groove 130G3a of the third groove pad 130-3a may surround a greater portion of the connection terminal contact region 130G than the annular groove 130G4a of the third groove pad 130-4a. In some embodiments, the annular groove 130G3a of the third groove pad 130-3a may surround about 270° of the connection terminal contact region 130G, and the annular groove 130G4a of the third groove pad 130-4a may surround about 180° of the connection terminal contact region 130G but the inventive concept is not limited thereto. That is, the annular groove 130G3a of the third groove pad 130-3a and the annular groove 130G4a of the third groove pad 130-4a may surround different parts of the connection terminal contact region 130G in consideration of the stress occurring in the edge region of the PCB 106f.

FIGS. 6A through 6F are respectively plan views of one surface of the PCBs 106a, 106b, 106c, 106d, 106e, and 106f. However, the same pads may be disposed on both surfaces of the PCBs 106a, 106b, 106c, 106d, 106e, and 106f. Alternatively, in consideration of a difference in stress that may occur in both surfaces of a PCB, various combinations of pads disposed on one surface of the PCBs 106a, 106b, 106c, 106d, 106e, and 106f of FIGS. 6A through 6F may be disposed on both surfaces of the PCB.

Alternatively, in some embodiments, in consideration of a difference in stress that may occur in both surfaces of a PCB, various combinations of pads disposed on one surface of the PCBs 106a, 106b, 106c, 106d, 106e, and 106f of FIGS. 6A through 6F and pads disposed on one surface of the PCBs 100a, 100b, 100c, and 100d of FIGS. 3A through 3D may be disposed on both surfaces of the PCB.

Figure 7A:
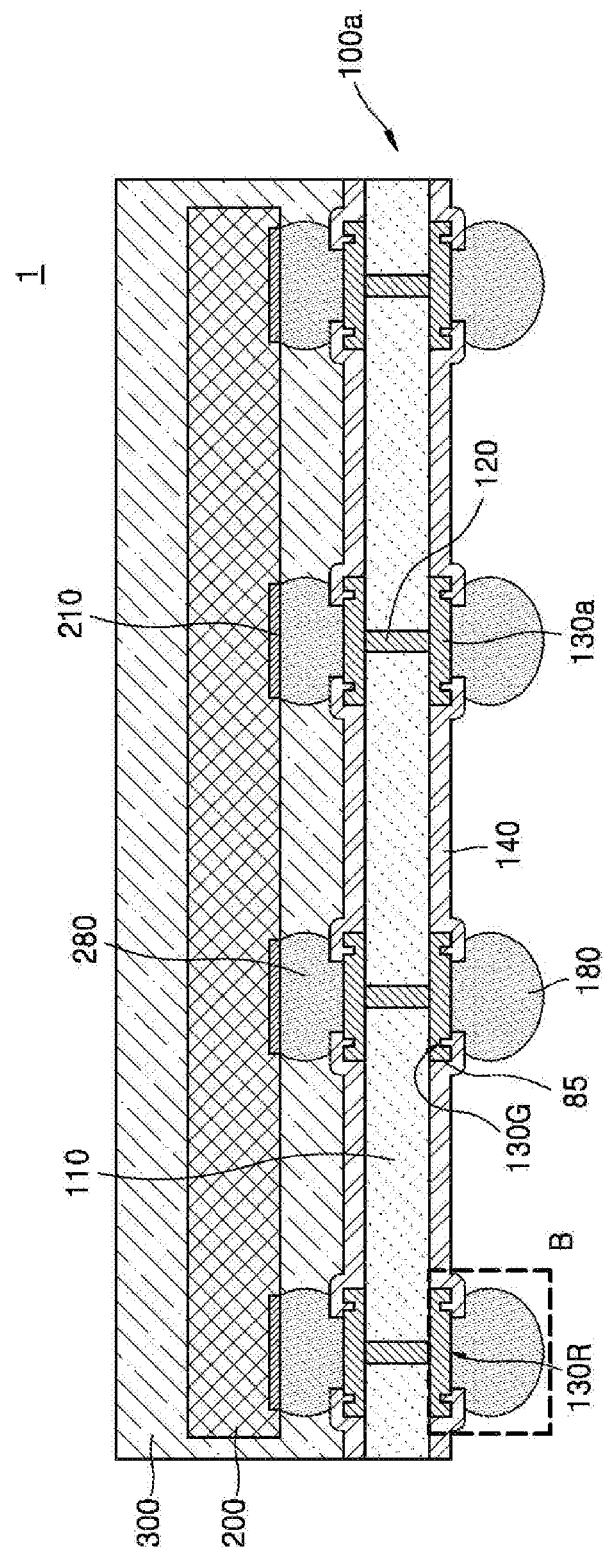
FIG. 7A is a cross-sectional view of a semiconductor package according to an embodiment.
Figure 7B:
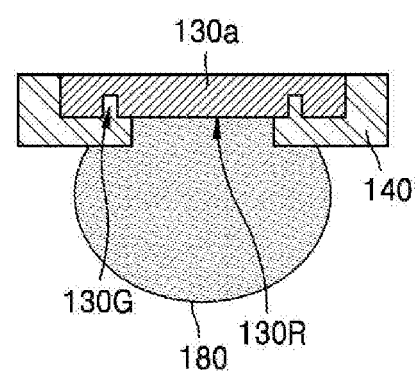
FIG. 7B is an enlarged cross-sectional view of a region B of FIG. 7A.

FIG. 7A is a cross-sectional view of a semiconductor package 1 according to an embodiment. FIG. 7B is an enlarged cross-sectional view of a region B of FIG. 7A.

Referring to FIGS. 7A and 7B, the semiconductor package 1 may include the PCB 100a, a semiconductor chip 200 electrically connected to the PCB 100a through chip connection terminals 280 attached to corresponding ones of the plurality of groove pads 130a disposed on an upper surface of the PCB 100a, and external connection terminals 180 attached to corresponding ones of the plurality of groove pads 130a disposed on a lower surface of the PCB 100a.

The PCB 100a may include the substrate base 110, the plurality of groove pads 130a disposed on upper and lower surfaces of the substrate base 110, and the solder resist layer 140 covering at least a portion of the upper and lower surfaces of the substrate base 110. The connection wirings 120 may be formed between the plurality of groove pads 130a. The connection wiring 120 may connect the upper groove pad 130a and the lower groove pad 130a and pass through the substrate base 110. In some embodiments, the connection wiring 120 may extend through the upper or lower surface of the substrate base 110.

The groove pad 130a may include the annular groove 130G in a side an opposite to the substrate base 110. The annular groove 130G may be spaced apart from the side surface 85 of the groove pad 130a. For example, the annular groove 130G may have a substantially uniform width and thus substantially uniform separation from the side surface 85 of the groove pad 130a. Inner and outer edges of the annular groove 130G may have a substantially circular shape in plan view. That is, the shape of the annular groove 130G in plan view may have a substantially ring shape.

The solder resist layer 140 may partially cover the groove pad 130a and define the connection terminal contact region 130R of the groove pad 130a that is not covered by the solder resist layer 140. The chip connection terminal 280 or the external connection terminal 180 may be attached to the connection terminal contact region 130R. The annular groove 130G may substantially surround the connection terminal contact region 130R.

The solder resist layer 140 may fill the annular groove 130G. Thus, the annular groove 130G may be covered by the solder resist layer 140 and may not be exposed to the outside. The solder resist layer 140 may also cover the inside of the groove pad 130a from the annular groove 130G. Thus, the connection terminal contact region 130R may be spaced apart from the annular groove 130G.

The chip connection terminal 280 or the external connection terminal 180 may contact the connection terminal contact region 130R. The chip connection terminal 280 or the external connection terminal 180 may entirely cover the connection terminal contact region 130R of the groove pad 130a. The connection terminal contact region 130R may be spaced apart from the annular groove 130G, and thus the chip connection terminal 280 or the external connection terminal 180 may be spaced apart from the annular groove 130G with the solder resist layer 140 therebetween.

A semiconductor device may be formed in an active surface of the semiconductor chip 200. For example, the active surface of the semiconductor chip 200 may face the PCB 100a, and the chip connection terminal 280 may be a solder ball or a bump.

A connection pad 210 may be formed on the active surface of the semiconductor chip 200. The chip connection terminal 280 may be disposed between the connection pad 210 of the semiconductor chip 200 and the groove pad 130a of the PCB 100a.

In some embodiments, a backside surface of the semiconductor chip 200 opposite to the active surface of the semiconductor chip 200 may face a side of the PCB 100a. In this case, the chip connection terminal 280 may be replaced with a bonding wire such that the bonding wire may extend to connect the connection pad 210 of the semiconductor chip 200 and the groove pad 130a of the PCB 100a.

The semiconductor chip 200 may include, for example, silicon (Si). Alternatively, the semiconductor chip 200 may include a semiconductor element such as germanium (Ge), or a compound semiconductor such as silicon carbide (SiC), gallium arsenide (GaAs), indium arsenide (InAs) or indium phosphide (InP). Alternatively, the semiconductor chip 200 may have a silicon-on-chip (SOI) structure. For example, the semiconductor chip 200 may include a buried oxide (BOX) layer. The semiconductor chip 200 may include a conductive region, for example, a well doped with impurities or a structure doped with impurities. The semiconductor chip 200 may also have various device isolation structures such as a shallow trench isolation (STI) structure.

The semiconductor device may include a system large scale integration (LSI), a flash memory, a dynamic random-access memory (DRAM), a static RAM (SRAM), an electrically erasable programmable read-only memory (EEPROM), a phase-change RAM (PRAM), a magnetoresistive RAM (MRAM), or a resistive random-access memory (RRAM). More specifically, the semiconductor device may include various types of a plurality of individual devices. The plurality of individual devices may include various microelectronic devices, for example, a metal-oxide-semiconductor field effect transistor (MOSFET) such as a complementary metal-insulator-semiconductor (CMOS) transistor, a system LSI, an image sensor such as a CMOS imaging sensor (CIS), a micro-electro-mechanical system (MEMS), an active device, and a passive device. The plurality of individual devices may be electrically connected to the conductive region. The semiconductor device may further include a conductive wiring line or a conductive plug for electrically connecting at least one of the plurality of individual devices or the plurality of individual devices and the conductive region. The plurality of individual devices may also be electrically separated from other adjacent individual devices by using insulating films.

The semiconductor device may include a multi-layer wiring structure for connecting the plurality of individual devices to other wirings. The multi-layered wiring structure may include a conductive wiring layer and a via plug. The conductive wiring layer and the via plug may include a wiring barrier film and a wiring metal layer. The wiring barrier film may include at least one material selected from titanium (Ti), titanium nitride (TiN), tantalum (Ta), and tantalum nitride (TaN). The wiring metal layer may include at least one metal selected from tungsten (W), aluminium (Al), and copper (Cu). The metal wiring layer and the via plug may include the same material. Alternatively, at least one of the metal wiring layer and the via plug may include different materials. The metal wiring layer and/or the via plug may have a multi-layer structure. That is, the wiring structure may be a multi-layer structure formed by alternately stacking two or more metal wiring layers or two or more via plugs.

In some embodiments, the semiconductor chip 200 may be a controller chip, a non-volatile memory chip, a volatile memory chip, and/or a dummy chip.

The non-volatile memory chip may be, for example, a NAND flash memory, an RRAM, an MRAM, a PRAM, or a ferroelectric RAM (FRAM). The non-volatile memory chip may be a semiconductor package including one non-volatile memory chip or a plurality of stacked non-volatile memory chips.

The controller chip may provide an interface and/or a protocol between a host and the non-volatile memory chip. The controller chip may provide a standard protocol such as parallel advanced technology attachment (PATA), serial advanced technology attachment (SATA), or peripheral component interconnect (PCI) express (PCIe) for interfacing the non-volatile memory chip and the host. Alternatively, the controller chip may perform wear levelling, garbage collection, bad block management, and error-correcting code (ECC) for the non-volatile memory chip.

The volatile memory chip may be a volatile memory semiconductor chip such as a DRAM. The volatile memory chip may store data or provide a cache. The volatile memory chip may be a semiconductor package including one volatile memory chip or a plurality of stacked volatile memory chips.

A plurality of semiconductor chips 200 may be attached to the PCB 100a. In some embodiments, the plurality of semiconductor chips 200 may be stacked. In some embodiments, the plurality of stacked semiconductor chips 200 may be electrically connected to each other via a through electrode.

An encapsulant such as a mold layer 300 may be formed on an upper surface of the PCB 100a to cover at least a portion of the upper surface of the PCB 100a and the semiconductor chip 200. The mold layer 300 may include, for example, an epoxy mold compound (EMC). In some embodiments, the mold layer 300 may expose an upper surface of the semiconductor chip 200.

In some embodiments, a portion of the mold layer 300 between the semiconductor chip 200 and the PCB 100a may be an underfill layer formed by using a capillary underfill method.

When the external connection terminal 180 is attached to a pad having no annular groove, stress concentration may occur in an edge region of the connection terminal contact region 130R of the pad, i.e. an edge region of a contact surface between the pad and the external connection terminal 180, which may damage an intermetallic compound formed in the contact surface between the pad and the external connection terminal 180. As a result, the reliability of an electrical connection between the external connection terminal 180 and the PCB 100a may be degraded.

However, when the external connection terminal 180 is attached to the groove pad 130a including the annular groove 130G, the stress changes to be concentrated at a corner of a lower surface of the annular groove 130G, which does not damage an intermetallic compound formed in the contact surface between the groove pad 130a and the external connection terminal 180. Thus, reliability of the electrical connection between the external connection terminal 180 and the PCB 100a can be improved. In particular, a portion of the groove pad 130a around the corner of the lower surface of the annular groove 130G may be an integrally formed metal material, which may prevent the groove pad 130a from being damaged due to the stress concentration.

Figure 8A:
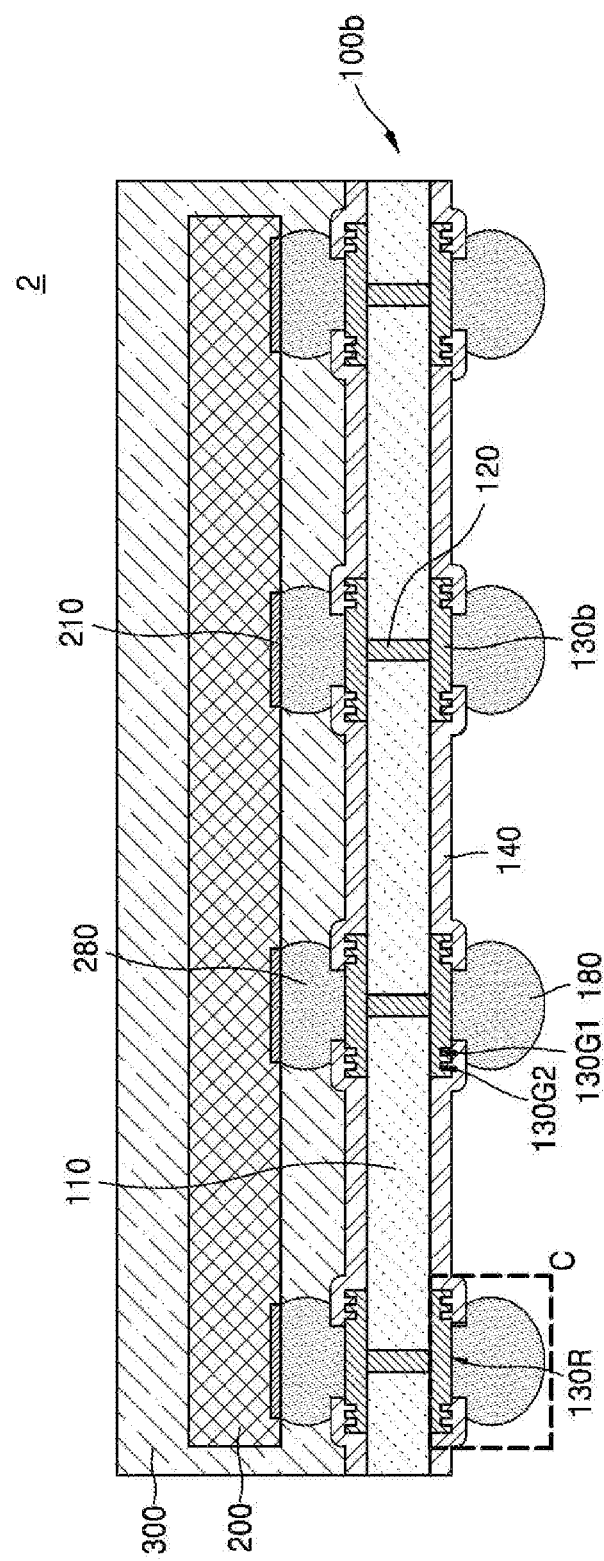
FIG. 8A is a cross-sectional view of a semiconductor package according to another embodiment.
Figure 8B:
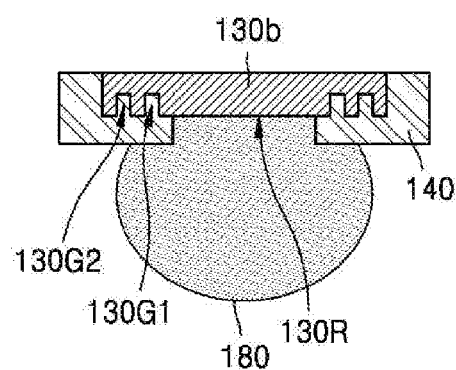
FIG. 8B is an enlarged cross-sectional view of a region C of FIG. 8A.

FIG. 8A is a cross-sectional view of a semiconductor package 2 according to another embodiment. FIG. 8B is an enlarged cross-sectional view of a region C of FIG. 8A. Redundant descriptions between FIGS. 8A and 8B and FIGS. 7A and 7B may be omitted.

Referring to FIGS. 8A and 8B, the semiconductor package 2 may include the PCB 100b, the semiconductor chip 200 electrically connected to the PCB 100b through the chip connection terminal 280 attached to each of the plurality of groove pads 130b disposed on an upper surface of the PCB 100b, and the external connection terminal 180 attached to each of the plurality of groove pads 130b disposed on a lower surface of the PCB 100b.

The groove pad 130b may include the annular grooves 130G1 and 130G2 in a side opposite to the substrate base 110. The annular grooves 130G1 and 130G2 may include the first annular groove 130G1 and the second annular groove 130G2. The first annular groove 130G1 and the second annular groove 130G2 may have substantially the same depth. The first groove 130G1 and the second annular groove 130G2 may be spaced apart from the side surface 86 of the groove pad 130b. For example, the first groove 130G1 and the second annular groove 130G2 may have a substantially uniform width and thus substantially uniform separation from the side surface 88 of the groove pad 130b. Inner and outer edges of each of the first annular groove 130G1 and the second annular groove 130G2 may have a substantially circular shape in plan view. That is, the shape of each of the first annular groove 130G1 and the second annular groove 130G2 in plan view may have a substantially ring shape.

The solder resist layer 140 may partially cover the groove pad 130b and define the connection terminal contact region 130R of the groove pad 130b that is not covered by the solder resist layer 140. The external connection terminal 180 may be attached to the connection terminal contact region 130R. The first annular groove 130G1 may surround the connection terminal contact region 130R. The second annular groove 130G2 may surround the first annular groove 130G1.

The solder resist layer 140 may fill the first annular groove 130G1 and the second annular groove 130G2. Thus, the first annular groove 130G1 and the second annular groove 130G2 may be covered by the solder resist layer 140 and may not be exposed to the outside. The solder resist layer 140 may also cover the inside of the groove pad 130b from the first annular groove 130G1. Thus, the connection terminal contact region 130R may be spaced apart from the first annular groove 130G1 and the second annular groove 130G2.

Figure 9A:
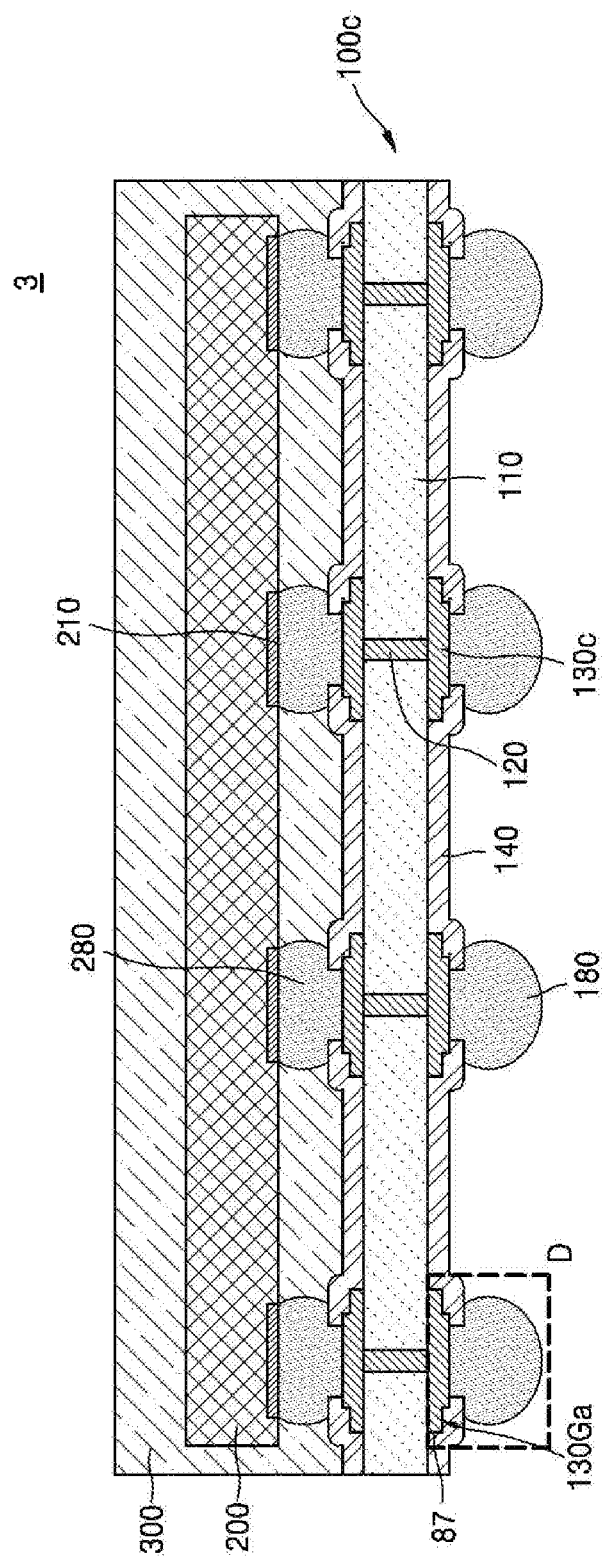
FIG. 9A is a cross-sectional view of a semiconductor package according to another embodiment.
Figure 9B:
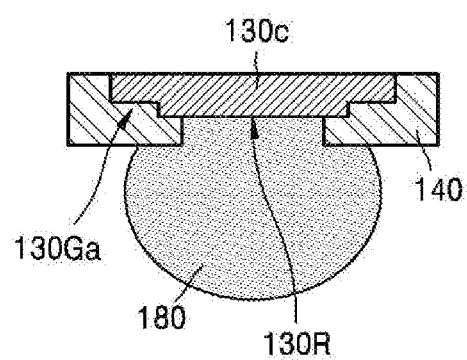
FIG. 9B is an enlarged cross-sectional view of a region D of FIG. 9A.

FIG. 9A is a cross-sectional view of a semiconductor package 3 according to another embodiment. FIG. 9B is an enlarged cross-sectional view of a region D of FIG. 9A. Redundant descriptions between FIGS. 9A and 9B and FIGS. 7A through 8B may be omitted.

Referring to FIGS. 9A and 9B, the semiconductor package 3 may include the PCB 100c, the semiconductor chip 200 electrically connected to the PCB 100c through the chip connection terminals 280 attached to corresponding ones of the plurality of groove pads 130c disposed on an upper surface of the PCB 100c, and the connection terminals 180 attached to corresponding ones of the plurality of groove pads 130c disposed on a lower surface of the PCB 100c.

The groove pad 130c may include the annular groove 130Ga in a side opposite to the substrate base 110. The annular groove 130Ga may inwardly extend from a side surface 87 of the groove pad 130c. An inner edge of the annular groove 130Ga may have a substantially circular shape, and an outer edge thereof may have the same shape as an edge of the side surface 87 of the groove pad 130c, for example, a rectangular shape in plan view.

The solder resist layer 140 may partially cover the groove pad 130c and define the connection terminal contact region 130R of the groove pad 130c that is not covered by the solder resist layer 140. The external connection terminal 180 may be attached to the connection terminal contact region 130R. The annular groove 130Ga may surround the connection terminal contact region 130R.

The solder resist layer 140 may fill the annular groove 130Ga. Thus, the annular groove 130Ga may be covered by the solder resist layer 140 and may not be exposed to the outside. The solder resist layer 140 may be formed to further cover the inside of the groove pad 130c from the annular groove 130Ga. Thus, the connection terminal contact region 130R may be spaced apart from the annular groove 130Ga.

Figure 10A:
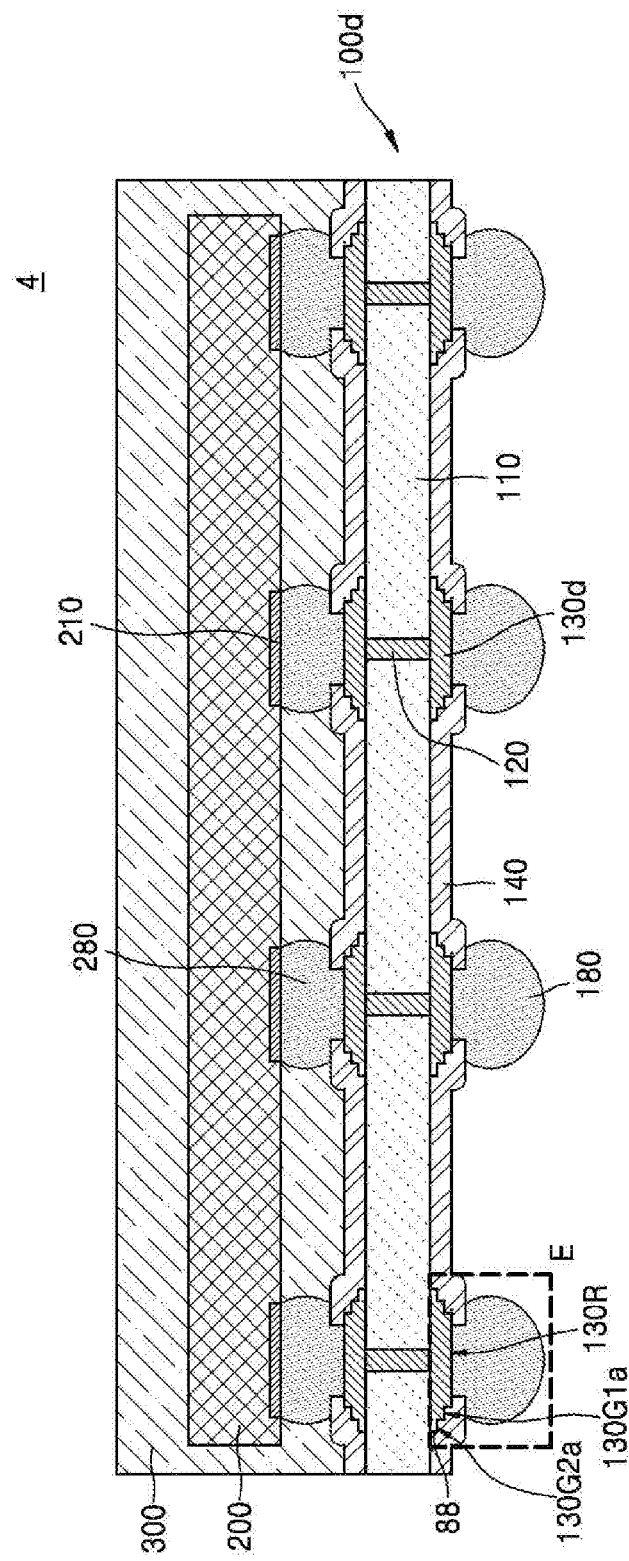
FIG. 10A is a cross-sectional view of a semiconductor package according to another embodiment.
Figure 10B:
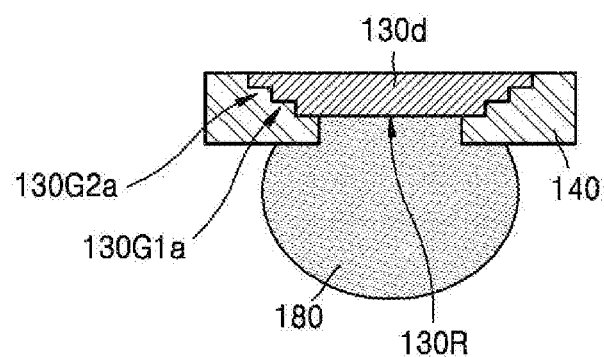
FIG. 10B is an enlarged cross-sectional view of a region E of FIG. 10A.

FIG. 10A is a cross-sectional view of a semiconductor package 4 according to another embodiment. FIG. 10B is an enlarged cross-sectional view of a region E of FIG. 10A. Redundant descriptions between FIGS. 10A and 10B and FIGS. 7A through 9B may be omitted.

Referring to FIGS. 10A and 10B, the semiconductor package 4 may include the PCB 100d, the semiconductor chip 200 electrically connected to the PCB 100d through the chip connection terminal 280 attached to corresponding ones of the plurality of groove pads 130d disposed on an upper surface of the PCB 100d, and the external connection terminal 180 attached to each of the plurality of groove pads 130d disposed on a lower surface of the PCB 100d.

The groove pad 130d may include the annular grooves 130G1a and 130G2a in a side opposite to the substrate base 110. The annular grooves 130G1a and 130G2a may include the first annular groove 130G1a and the second annular groove 130G2a. The first annular groove 130G1a and the second annular groove 130G2a may have different depths. The depth of the first annular groove 130G1a may be greater than that of the second annular groove 130G2a. The second annular groove 130G2a may inwardly extend from a side surface 88 of the groove pad 130d. An inner edge of the second annular groove 130G2a may have a substantially circular shape, and an outer edge thereof may have the same shape as an edge of the side surface 88 of the groove pad 130d, for example, a rectangular shape in plan view. Inner and outer edges of the first annular groove 130G1a may have a substantially circular shape in plan view. That is, the shape of the first annular groove 130G1a in plan view may have a substantially ring shape.

The solder resist layer 140 may partially cover the groove pad 130d and define the connection terminal contact region 130R of the groove pad 130d that is not covered by the solder resist layer 140. The external connection terminal 180 may be attached to the connection terminal contact region 130R. The first annular groove 130G1a may surround the connection terminal contact region 130R. The second annular groove 130G2a may surround the first annular groove 130G1a.

The solder resist layer 140 may fill the first annular groove 130G1a and the second annular groove 130G2a. Thus, the first annular groove 130G1a and the second annular groove 130G2*a* may be covered by the solder resist layer 140 and may not be exposed to the outside. The solder resist layer 140 may also cover the inside of the groove pad 130*d* from the first annular groove 130G1*a*. Thus, the connection terminal contact region 130R may be spaced apart from the first annular groove 130G1*a* and the second annular groove 130G2*a*.

The semiconductor packages 1, 2, 3, and 4 including the PCBs 100*a*, 100*b*, 100*c*, and 100*d* of FIGS. 3A through 3D are illustrated in FIGS. 7A through 10B. However, the inventive concept is not limited thereto and semiconductor packages including the PCBs 100*a*, 100*b*, 100*c*, 100*d*, 102*a*, 102*b*, 104*a*, 104*b*, 106*a*, 106*b*, 106*c*, 106*d*, 106*e*, and 106*f* described with reference to FIGS. 3A through 6F or PCBs including combinations of pads disposed on one surface of each of the PCBs 100*a*, 100*b*, 100*c*, 100*d*, 102*a*, 102*b*, 104*a*, 104*b*, 106*a*, 106*b*, 106*c*, 106*d*, 106*e*, and 106*f* may also be formed.

Figure 11:
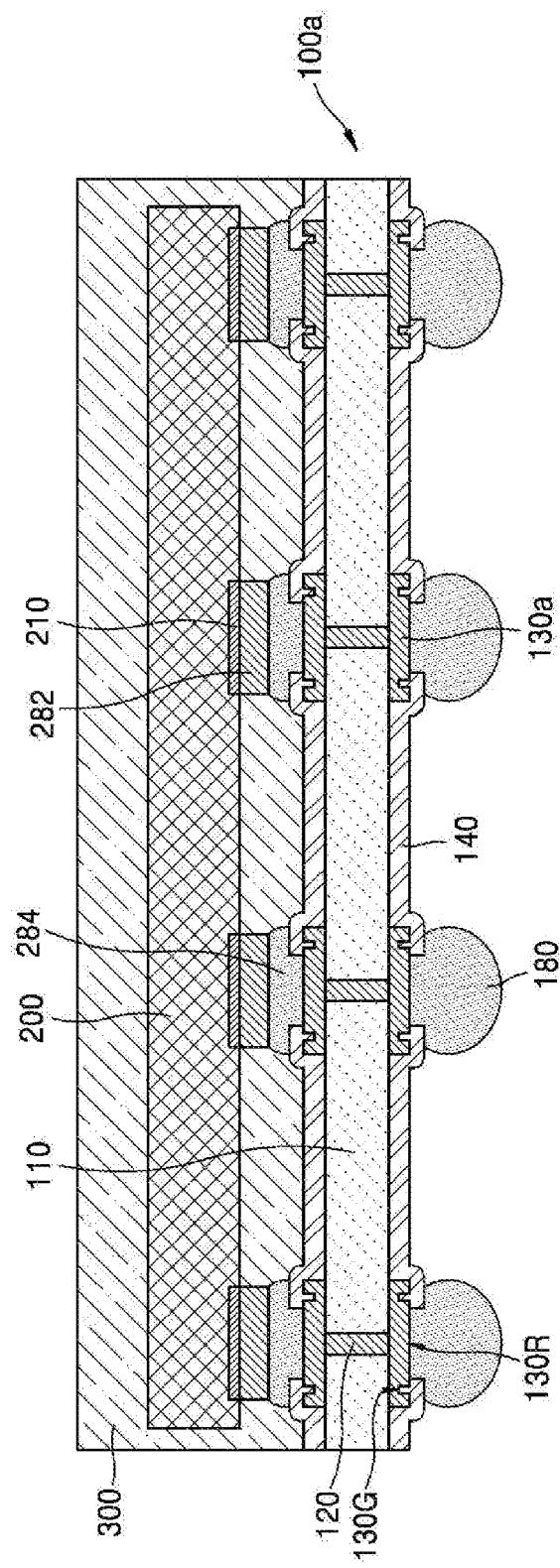
FIG. 11 is a cross-sectional view of a semiconductor package according to an embodiment.

FIG. 11 is a cross-sectional view of a semiconductor package 5 according to an embodiment.

Referring to FIG. 11, the semiconductor package 5 may include the PCB 100*a*, the semiconductor chip 200 electrically connected to the PCB 100*a* through chip connection terminals 282 and 284 attached to corresponding ones of the plurality of groove pads 130*a* disposed on an upper surface of the PCB 100*a*, and the external connection terminals 180 attached to corresponding ones of the plurality of groove pads 130*a* disposed on a lower surface of the PCB 100*a*.

The semiconductor package 1 of FIG. 7A and the semiconductor package 5 of FIG. 11 are similar for the most part in the configuration except that the chip connection terminal 280 included in the semiconductor package 1 of FIG. 7A has a shape of a solder ball, whereas the chip connection terminals 282 and 284 included in the semiconductor package 5 of FIG. 11 include a Cu pillar 282 formed on the connection pad 210 of the semiconductor chip 200 and a solder layer 284 disposed between the Cu pillar 282 and the groove pad 130*a*, and thus a detailed description thereof is omitted.

Although not shown, the PCBs 100*a*, 100*b*, 100*c*, 100*d*, 102*a*, 102*b*, 104*a*, 104*b*, 106*a*, 106*b*, 106*c*, 106*d*, 106*e*, and 106*f* described with reference to FIGS. 3A through 6F or PCBs including combinations of pads disposed on one surface of each of the PCBs 100*a*, 100*b*, 100*c*, 100*d*, 102*a*, 102*b*, 104*a*, 104*b*, 106*a*, 106*b*, 106*c*, 106*d*, 106*e*, and 106*f* may also be applied to the semiconductor package 5 of FIG. 11.

Figure 12:
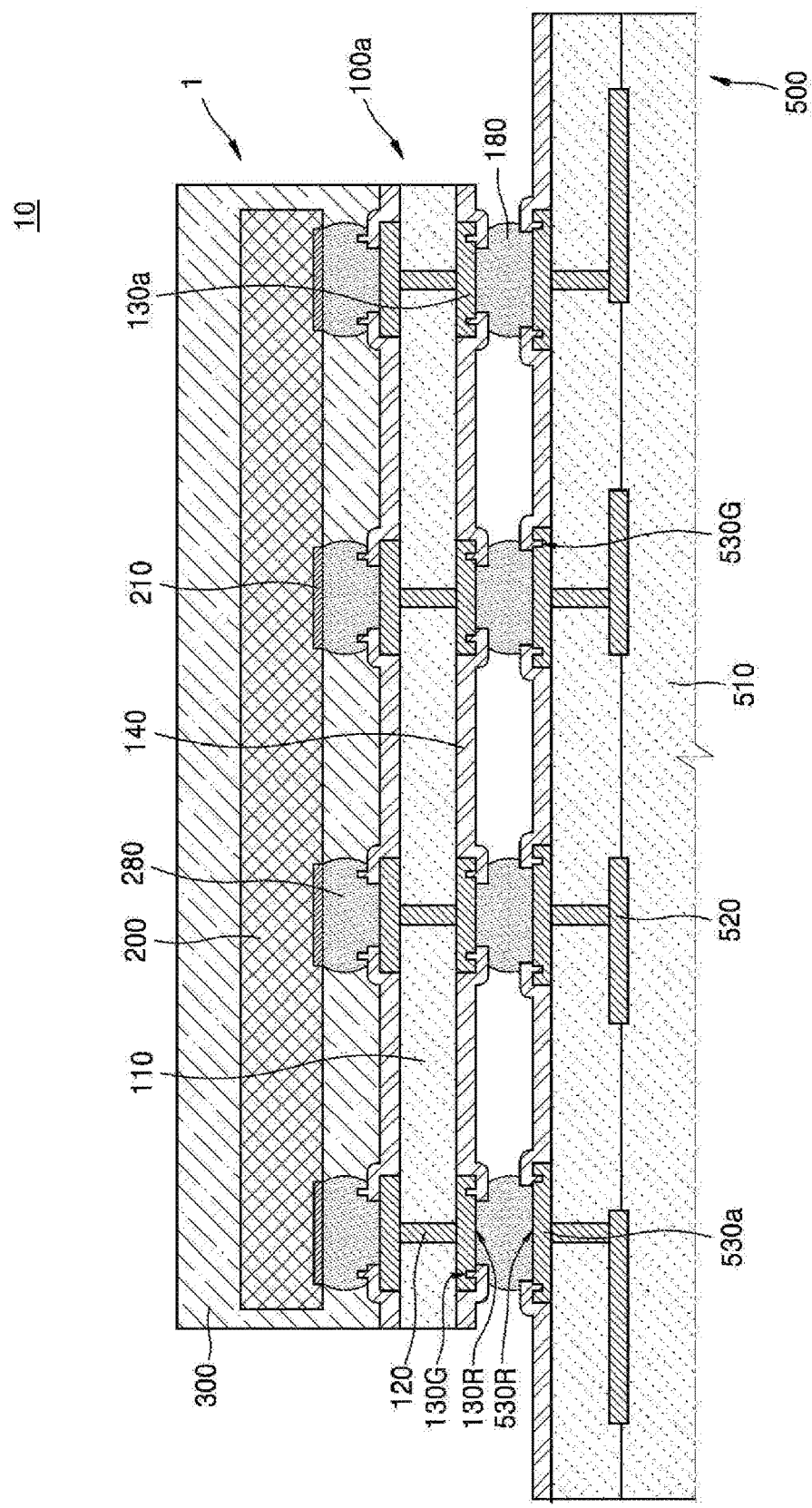
FIG. 12 is a cross-sectional view of a main part of an electronic system according to an embodiment.

FIG. 12 is a cross-sectional view of a main part of an electronic system 10 according to an embodiment.

Referring to FIG. 12, the electronic system 10 may include the semiconductor package 1 attached to a main board 500. The description of the semiconductor package 1 is provided with reference to FIGS. 7A through 11, and thus the detailed description thereof is omitted. In particular, although the electronic system 10 includes the semiconductor package 1 of FIGS. 7A and 7B in FIG. 12, the electronic system 10 may include the semiconductor packages 1, 2, 3, 4, and 5 described with reference to FIGS. 7A and 7B, modifications thereof, or at least two thereof.

The main board 500 may include a main substrate base 510, a plurality of main groove pads 530*a* disposed on at least one surface of the main substrate base 510, and a solder resist layer 540 covering at least a portion of the at least one surface of the main substrate base 510. In some embodiments, the main board 500 may also include a connection wiring 520 formed inside of the main substrate base 510 and/or on at least one surface thereof.

The external connection terminal 180 may be disposed between the main groove pad 530*a* of the main board 500 and the groove pad 130*a* of the PCB 100*a*, thereby electrically connecting the semiconductor package 1 with the main board 500.

The main board 500 may be a PCB but is not limited thereto. All types of substrates including a pad for an electrical connection to a connection terminal may be employed.

The electronic system 10 may employ the groove pad 130*a* and/or the main groove pad 530*a* to all or some of the pads 130*a* and 530*a* contacting the external connection terminal 180 or the chip connection terminal 280 in which stress may occur, thereby enhancing reliability of the electronic system 10.

Although all the pads 130*a* and 530*a* have the same shape as the groove pad 130*a* of FIG. 2A, in consideration of the stress that occurs in the electronic system 10, a pad having various shapes and layouts may be employed as described with reference to FIGS. 1 through 11.

FIG. 13A through 13F are cross-sectional views for describing a method of manufacturing a PCB according to an embodiment.

Figure 13A:
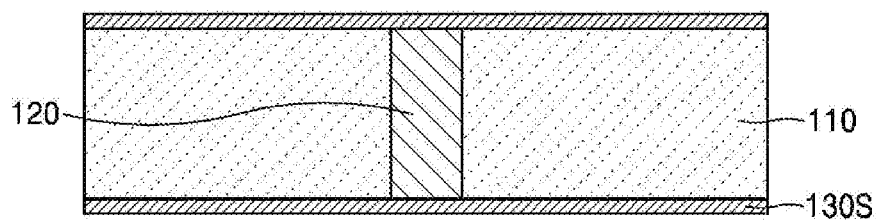
FIG. 13A through 13F are cross-sectional views for describing a method of manufacturing a PCB according to an embodiment.

Referring to FIG. 13A, a substrate base 110 is formed including the connection wiring 120 extending therethrough. A seed layer 130S may be formed on upper and lower surfaces of the substrate base 110. The connection wiring 120 may be formed by wet or dry etching the substrate base 110 or by forming a hole in the substrate base 110 through mechanical drilling or laser drilling and then performing a plating process. Laser drilling may use, for example, a $CO_2$ laser, a YAG laser, an excimer laser, or a Cu-vapor laser or a hybrid combination of these lasers.

In some embodiments, the connection wiring 120 may be formed on an upper surface and/or a lower surface of the substrate base 110. In this instance, the connection wiring 120 may be formed during a process of forming a base pad 1301 of FIG. 10E that will be described later, and thus an illustration and a description thereof are omitted.

The seed layer 130S may be formed on the substrate base 110 by using a sputtering method or a laminating method. In some embodiments, the seed layer 130S may include copper or a copper alloy.

Figure 13B:
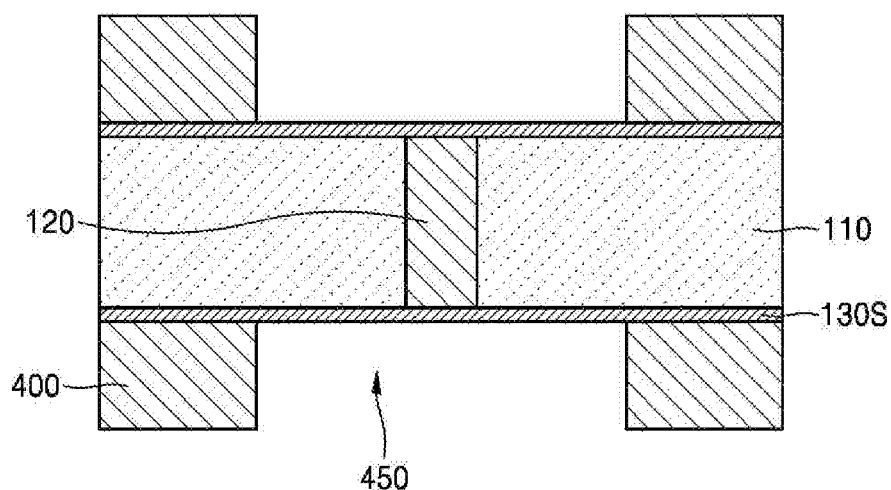

Referring to FIG. 13B, a mask pattern 400 may be formed to cover a portion of the substrate base 110 on which the seed layer 130S is formed. The mask pattern 400 may have an exposure space 450 exposing at least a portion of the seed layer 130S.

Figure 13C:
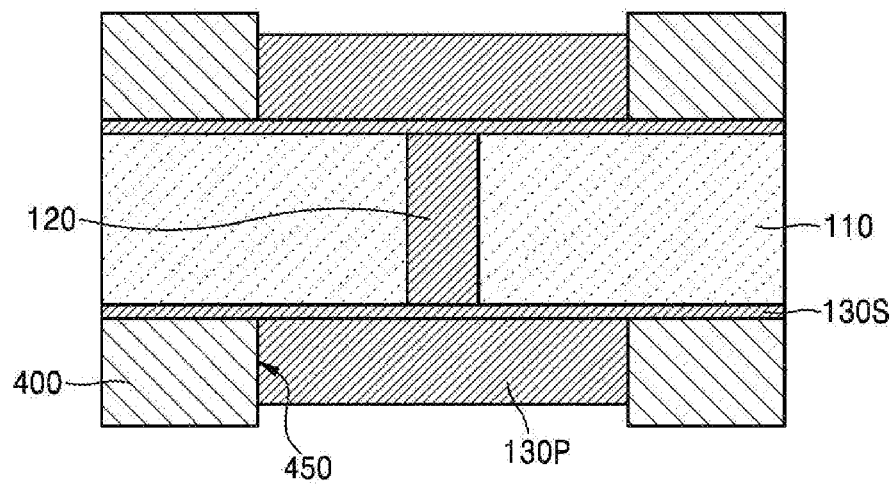

Referring to FIG. 13C, a plating layer 130P may be formed on a portion of the seed layer 130S exposed through the exposure space 450. The plating layer 130P may be formed to cover a surface of the seed layer 130S to fill at least a portion of the exposure space 450. For example, the plating layer 130P may include copper, nickel, stainless steel, or beryllium copper. When the seed layer 130S and the plating layer 130P include the same material, the seed layer 130S and the plating layer 130P may be integrally formed and may not be identified separately.

The plating layer 130P may be formed through plating by using the seed layer 130S. The plating layer 130P may be formed through immersion plating, electroless plating, electroplating, or a combination thereof. In some embodiments, the plating layer 130P may be formed through applying a current density by using a plating solution containing an additive. The additive may be at least one of, for example, a leveling additive capable of leveling the plating layer 130P, a grain-refining additive capable of reducing a size of particles of the plating layer 130P, a stress-reducing additive capable of reducing stress in the plating layer 130P while being plated thereon, or a wetting agent capable of making plating atoms adhere well to a surface of a cathode.

Figure 13D:
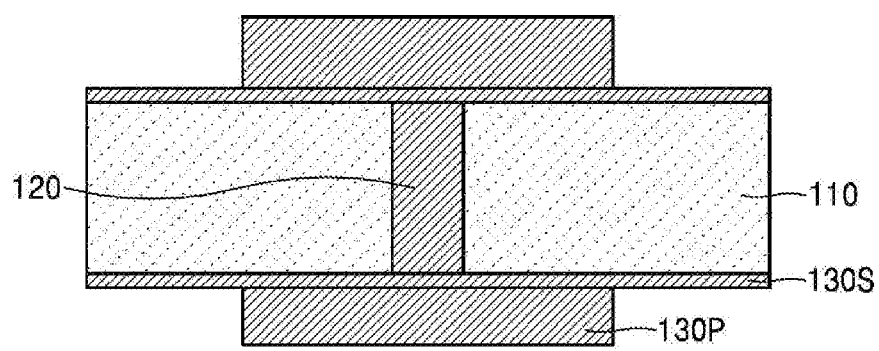

Referring to FIG. 13D, the mask pattern 400 of FIG. 13C may be removed. Ashing and stripping processes may be used to remove the mask pattern 400.

Figure 13E:
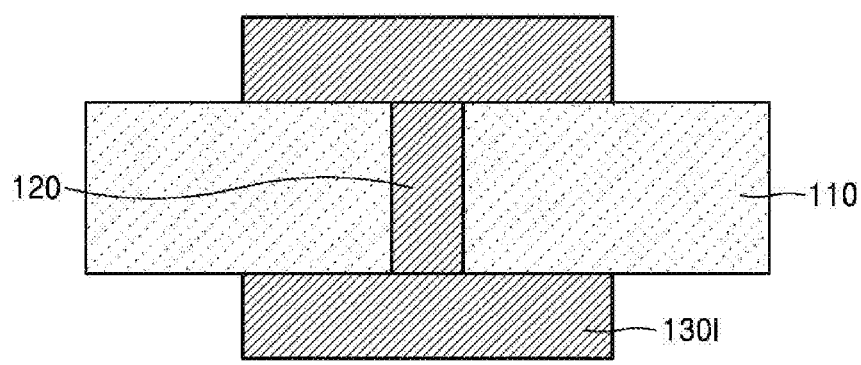

Referring to FIG. 13E, a base pad 130I may be formed by removing a portion of the seed layer 130S of FIG. 13D exposed by removing the mask pattern 400 of FIG. 13C and by exposing a portion of the substrate base 110. While removing the seed layer 130S, a portion of the plating layer 130P of FIG. 13D may also be removed. A chemical etching method may be used to remove the seed layer 130S. The chemical etching method of removing the seed layer 130S may use an etching solution such as ferric chloride, hydrogen peroxide/sulphuric acid, chromic-sulphuric acid, cupric chloride, ammonium persulphate, and alkaline ammoniacal/ammonium chloride.

Figure 13F:
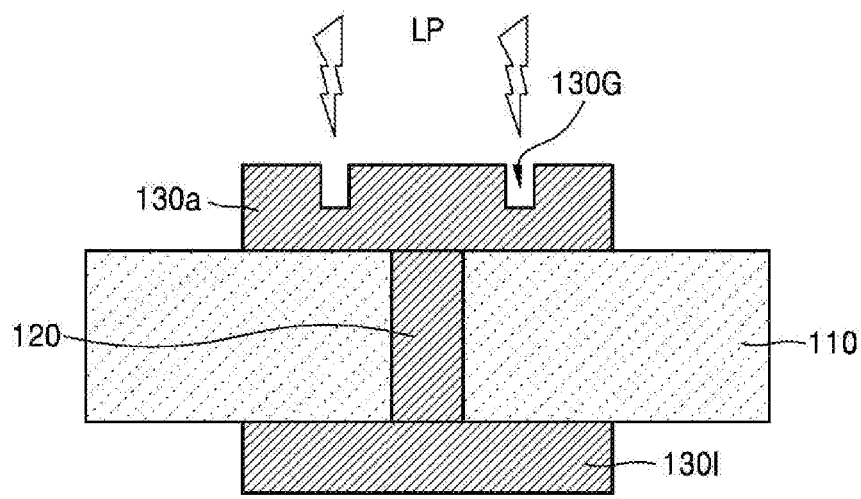

Referring to FIG. 13F, the groove pad 130a including the annular groove 130G may be formed through laser processing LP. The laser processing LP may use, for example, a $CO_2$ laser, a YAG laser, an excimer laser, or a Cu-vapor laser or a hybrid combination of these lasers.

Thereafter, the solder resist layer 140 filling the annular groove 130G shown in FIG. 2A may be formed, thereby manufacturing the PCB.

Although the method of manufacturing the PCB including the groove pad 130a of FIG. 2A is described with reference to FIGS. 13A through 13F, a PCB including the groove pads 130b, 130c, and 130d of FIGS. 2B through 2D may also be manufactured, and thus a detailed description thereof is omitted.

When laser processing LP is not applied to the base pad 130I, the base pad 130I may be a planar pad 130-N of FIG. 4A, for example.

Figure 14A:
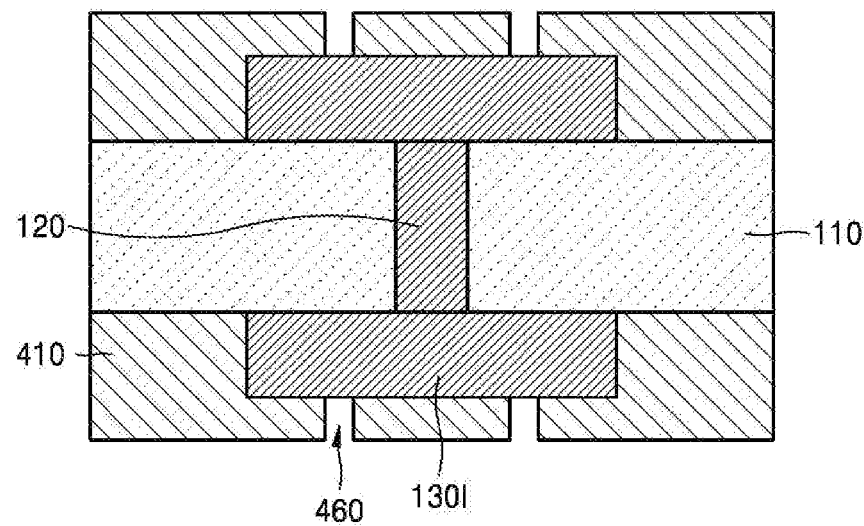
FIGS. 14A and 14B are cross-sectional views for describing a method of manufacturing a PCB according to another embodiment.
Figure 14B:
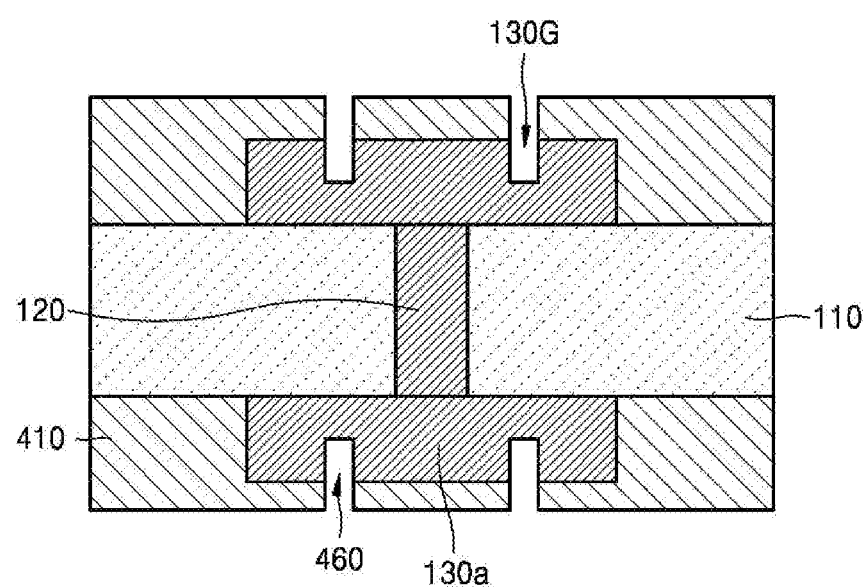

FIGS. 14A and 14B are cross-sectional views for describing a method of manufacturing a PCB according to another embodiment. More specifically, FIGS. 14A and 14B illustrate a process after FIG. 13E, and thus redundant descriptions of FIGS. 14A and 14B and FIGS. 13A through 13F are omitted.

Referring to FIG. 14A, a mask layer 410 including a through groove 460 exposing a portion of the base pad 130I may be formed.

Referring to FIG. 14B, the groove pad 130a including the annular groove 130G may be formed by removing a portion of the base pad 130I of FIG. 14A exposed through the through groove 460, by using the mask layer 410 as an etch mask.

A chemical etching method may be used to form the annular groove 130G. The chemical etching method of forming the annular groove 130G may use an etching solution such as ferric chloride, hydrogen peroxide/sulphuric acid, chromic-sulphuric acid, cupric chloride, ammonium persulphate, and alkaline ammoniacal/ammonium chloride.

Thereafter, the solder resist layer 140 filling the annular groove 130G shown in FIG. 2A may be formed, thereby manufacturing the PCB.

Although the method of manufacturing the PCB including the groove pad 130a of FIG. 2A is described with reference to FIGS. 14A and 14B, a PCB including the groove pads 130b, 130c, and 130d of FIGS. 2B through 2D may also be manufactured, and thus a detailed description thereof is omitted. For example, a PCB including the groove pad 130d of FIG. 2D may use two chemical etching methods of forming the first annular groove 130G1a and the second annular groove 130G2a.

Figure 15A:
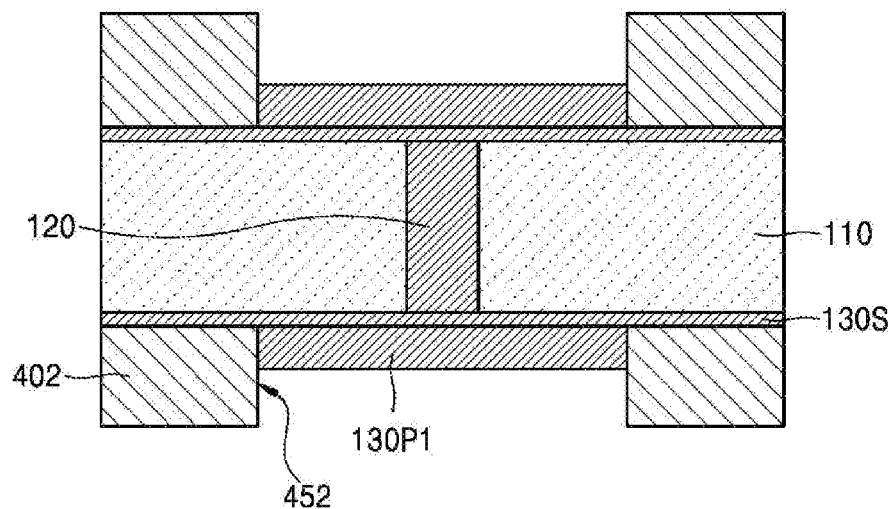
FIG. 15A through 15C are cross-sectional views for describing a method of manufacturing a PCB according to another embodiment.
Figure 15B:
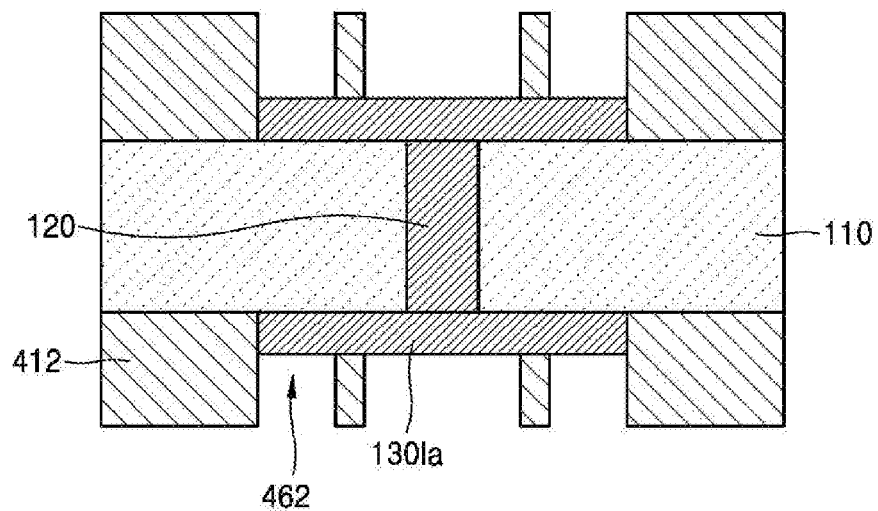
Figure 15C:
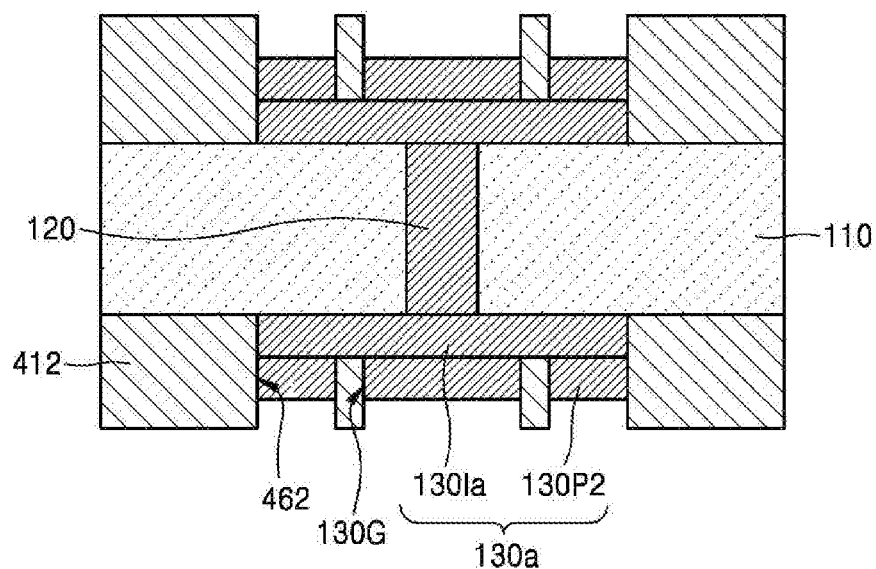

FIG. 15A through 15C are cross-sectional views for describing a method of manufacturing a PCB according to another embodiment. More specifically, FIG. 15A through 15C illustrate a process after FIG. 13A, and thus redundant descriptions of FIG. 15A through 15C and FIGS. 13A through 13F are omitted.

Referring to FIG. 15A, a first mask pattern 402 may be formed to cover a portion of the substrate base 110 in which the seed layer 130S is formed. The first mask pattern 402 may include a first exposure space 452 exposing at least a portion of the seed layer 130S.

Thereafter, a first plating layer 130P1 may be formed on a portion of the seed layer 130S exposed through the first exposure space 452. The first plating layer 130P1 may be formed to cover a surface of the seed layer 130S in order to fill at least a portion of the first exposure space 452. The first plating layer 130P1 may be formed to have a smaller thickness than that of the plating layer 130P of FIG. 13C.

The first plating layer 130P1 may be formed through plating by using the seed layer 130S. The first plating layer 130P1 may be formed through immersion plating, electroless plating, electroplating, or a combination thereof.

Referring to FIG. 15B, a base pad 130Ia may be formed by removing a portion of the seed layer 130S of FIG. 15A exposed by removing the first mask pattern 402 of FIG. 15A and by exposing a portion of the substrate base 110. During a process of removing the seed layer 130S, a portion of the first plating layer 130P1 of FIG. 15A may also be removed.

A chemical etching method may be used to remove the seed layer 130S. The chemical etching method of removing the seed layer 130S may use an etching solution such as ferric chloride, hydrogen peroxide/sulphuric acid, chromic-sulphuric acid, cupric chloride, ammonium persulphate, and alkaline ammoniacal/ammonium chloride. Ashing and stripping processes may be used to remove the first mask pattern 402.

Thereafter, a second mask pattern 412 may be formed to cover a portion of the substrate base 110 in which the base pad 130a is formed. The second mask pattern 412 may include a second exposure space 462 exposing at least a portion of the base pad 130Ia.

Referring to FIG. 15C, the groove pad 130a including the annular groove 130G may be formed by forming a second plating layer 130P2 on the base pad 130Ia exposed through the second exposure space 462. The second plating layer 130P2 may be formed to cover a surface of the base pad 130Ia in order to fill at least a portion of the second exposure space 462.

The second plating layer 130P2 may be formed through plating by using the base pad 130Ia as a seed. The second plating layer 130P2 may be formed through immersion plating, electroless plating, electroplating, or a combination thereof. When the base pad 130Ia and the second plating layer 130P2 include the same material, the base pad 130Ia and the second plating layer 130P2 may be integrally formed and may not be separately identified.

The groove pad 130a may include the annular groove 130G corresponding to a portion of the second mask patter 412 covering a portion of the surface of the base pad 130Ia.

Thereafter, the second mask patter 412 may be removed, and the solder resist 140 filling the annular groove 130G shown in FIG. 2A may be formed, thereby manufacturing the PCB.

If the second mask patter 412 covering the surface of the base pad 130Ia is not present, the planar pad 130-N of FIG. 4A, etc. may also be formed.

Although the method of manufacturing the PCB including the groove pad 130*a* of FIG. 2A is described with reference to FIGS. 15A through 15C, a PCB including the groove pads 130*b*, 130*c*, and 130*d* of FIGS. 2B through 2D may also be manufactured, and thus a detailed description thereof is omitted. For example, a PCB including the groove pad 130*d* including the first annular groove 130G1*a* and the second annular groove 130G2*a* of FIG. 2D may form the groove pad 130*d* by forming first through third plating layers through three plating processes.

Figure 16:
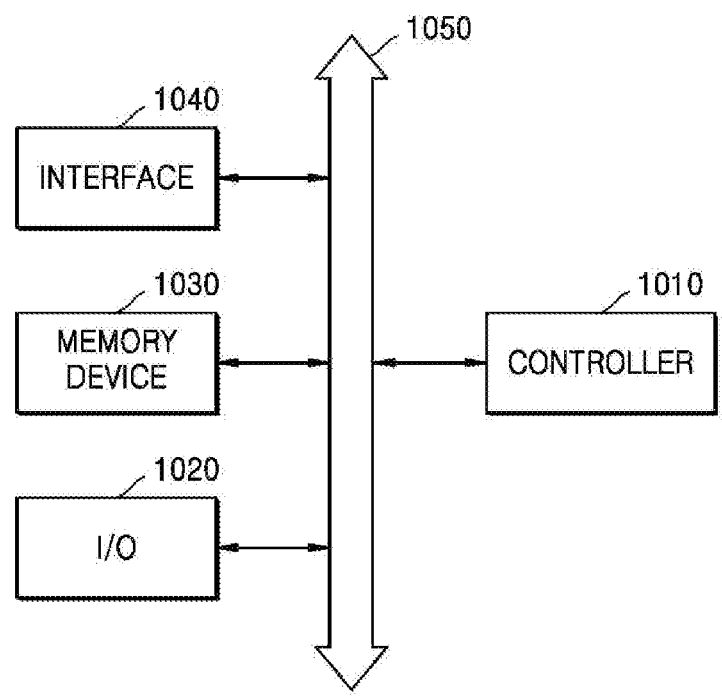
FIG. 16 is a diagram of a configuration of a system according to some embodiments.

FIG. 16 is a diagram of a configuration of a system 1000 according to some embodiments.

Referring to FIG. 16, the system 1000 may include a controller 1010, an input/output device 1020, a memory device 1030, and an interface 1040. The system 1000 may be a mobile system or a system for transmitting or receiving information. In some embodiments, the mobile system may be a personal digital assistant (PDA), a portable computer, a web tablet, a wireless phone, a mobile phone, a digital music player, or a memory card. The system 1000 may include a PCB and/or a semiconductor package according to some embodiments. For example, the system 1000 may include at least one of the PCBs 100, 100*a*, 100*b*, 100*c*, 100*d*, 102*a*, 102*b*, 104*a*, 104*b*, 106*a*, 106*b*, 106*c*, 106*d*, 106*e*, and 160*f* and/or the semiconductor packages 1, 2, 3, 4, and 5 described with reference to FIG. 1 through 15C.

The controller 1010 for controlling an execution program in the system 1000 may include a microprocessor, a digital signal processor, a microcontroller, or a device similar to these. For example, the controller 1010 may include at least one of the PCBs 100, 100*a*, 100*b*, 100*c*, 100*d*, 102*a*, 102*b*, 104*a*, 104*b*, 106*a*, 106*b*, 106*c*, 106*d*, 106*e*, and 160*f* and/or the semiconductor packages 1, 2, 3, 4, and 5 described with reference to FIG. 1 through 15C.

The input/output device 1020 may be used to input or output data of the system 1000. The system 1000 may be connected to an external device, for example, a personal computer or a network, through the input/output device 1020 and may exchange data with the external device. The input/output device 1020 may be, for example, a keypad, a keyboard, or a display.

The memory device 1030 may store code and/or data for operating the controller 1010 or may store data processed by the controller 1010. For example, the memory device 1030 may include at least one of the PCBs 100, 100*a*, 100*b*, 100*c*, 100*d*, 102*a*, 102*b*, 104*a*, 104*b*, 106*a*, 106*b*, 106*c*, 106*d*, 106*e*, and 160*f* and/or the semiconductor packages 1, 2, 3, 4, and 5 described with reference to FIG. 1 through 15C.

The interface 1040 may be a data transmission path between the system 1000 and an external device. The controller 1010, the input/output device 1020, the memory device 1030, and the interface 1040 may communicate with each other via a bus 1050. The system 1000 may be use in a mobile phone, an MP3 player, a navigation system, a portable multimedia player (PMP), a solid state disk (SSD), or a household appliance.

Therefore, the system 1000 according to an embodiment may reliably operate since an electrical connection between internal connection terminals of the system 1000 has reliability.

While the inventive concept has been particularly shown and described with reference to embodiments thereof, it will be understood that various changes in form and details may be made therein without departing from the spirit and scope of the following claims.

What is claimed is:

1. A printed circuit board (PCB) comprising:
a substrate base;
a plurality of pads on upper and lower surfaces of the substrate base, the plurality of pads including a first surface parallel to the upper or lower surface of the substrate base and facing toward the substrate base, a second surface opposite the first surface and an edge surface extending from the first surface to the second surface; and
a solder resist layer covering at least a portion of the upper and lower surfaces of the substrate base,
wherein at least some of the plurality of pads are groove pads comprising at least one annular groove in the second surface,
wherein, for each of the groove pads, a portion of the first surface extending from the edge surface is coplanar with another portion of the first surface located between the at least one annular groove and the substrate base;
wherein the groove pads comprise a first groove pad including one annular groove and a second groove pad including two annular grooves,
wherein the first groove pad is disposed closer to a center of the substrate base from a perimeter of the substrate base relative to the second groove pad.

2. The PCB of claim 1, wherein the solder resist layer fills at least a portion of the at least one annular groove.

3. The PCB of claim 1, wherein the solder resist layer covers a portion of at least one of the plurality of pads and defines a connection terminal contact region therein.

4. The PCB of claim 3, wherein the at least one annular groove of at least one of the groove pads is spaced apart from the connection terminal contact region.

5. The PCB of claim 1, wherein at least some of the groove pads comprise at least two annular grooves spaced apart from each other.

6. The PCB of claim 5, wherein the at least two annular grooves spaced apart from each other have substantially the same depth.

7. The PCB of claim 1, wherein at least some of the groove pads comprise at least two annular grooves connected to each other.

8. The PCB of claim 7, wherein the at least two annular grooves connected to each other have different depths.

9. The PCB of claim 1, wherein some of the plurality of pads are groove pads, and others of the plurality of pads are planar pads,
wherein the planar pads are disposed closer to a center of the substrate base from a perimeter of the substrate base relative to the groove pads.

10. A device comprising:
a substrate base;
a plurality of pads on upper and lower surfaces of the substrate base; and
a solder resist layer covering a portion of the upper and lower surfaces of the substrate base,
wherein each pad comprises a first side and a second side, wherein the first side is parallel to the upper or lower surface of the substrate base and is arranged adjacent to the substrate base and wherein the second side is arranged opposite to the first side,
wherein at least some of the plurality of pads are groove pads comprising at least one groove formed in the second side of the groove pads, wherein the solder resist layer defines a connection terminal contact region in the second side of the groove pads, wherein the at least one groove substantially surrounds the connection terminal contact region, wherein, for each groove pad, a portion of the first side located between the at least one groove and the substrate base is coplanar with another portion of the first side located between the connection terminal contact region and the substrate base;

wherein the grooves comprise a first annular groove and a second annular groove connected to each other, and wherein the second annular groove extends inwardly from a side surface of one of the groove pads, and wherein an inner edge of the second annular groove has a circular shape in plan view and an outer edge thereof has the same shape as that of a perimeter of the groove pad.

11. The device of claim 10, further comprising a plurality of connection terminals attached to corresponding ones of the groove pads to form a contact surface between the plurality of connection terminals and the corresponding ones of the groove pads, wherein the at least one groove substantially surrounds the contact surface between the plurality of connection terminals and the corresponding ones of the groove pads.

12. The device of claim 10, wherein the grooves comprise an annular groove.

13. The device of claim 12, wherein the annular groove extends inwardly from a side surface of a corresponding one of the groove pads.

* * * * *